(12) United States Patent
Takagi et al.

(10) Patent No.: US 6,786,627 B2
(45) Date of Patent: Sep. 7, 2004

(54) LIGHT GENERATING MODULE

(75) Inventors: Toshio Takagi, Yokohama (JP); Hisao Go, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/247,790

(22) Filed: Sep. 20, 2002

(65) Prior Publication Data

US 2003/0128552 A1 Jul. 10, 2003

(30) Foreign Application Priority Data

Sep. 21, 2001 (JP) .................................... P2001-289292

(51) Int. Cl.⁷ .............................................. H01L 33/00
(52) U.S. Cl. ................. 362/555; 362/581; 362/373; 362/553
(58) Field of Search ................. 362/553, 264, 362/294, 345, 555, 581, 800, 455, 259, 268, 373, 547, 218, 580; 257/98; 372/101; 385/88, 93

(56) References Cited

U.S. PATENT DOCUMENTS

| | | | | |
|---|---|---|---|---|
| 5,345,373 A | * | 9/1994 | Tanida | 362/455 |
| 5,416,869 A | * | 5/1995 | Yoshino | 385/88 |
| 5,751,877 A | * | 5/1998 | Ishizaka et al. | 385/93 |
| 6,207,950 B1 | | 3/2001 | Verdiell | 250/239 |
| 6,511,236 B1 | | 1/2003 | Webjorn et al. | 385/91 |
| 2002/0191655 A1 | | 12/2002 | Heck et al. | 372/36 |

FOREIGN PATENT DOCUMENTS

| | | |
|---|---|---|
| JP | 01-199483 | 8/1989 |
| JP | 2000-277843 | 10/2000 |
| JP | 2001-144361 | 5/2001 |
| JP | 2002-232058 | 8/2002 |
| JP | 2002-252407 | 9/2002 |
| JP | 2002-270942 | 9/2002 |
| JP | 2002-329920 | 11/2002 |

* cited by examiner

Primary Examiner—Thomas M. Sember
Assistant Examiner—Bao Q Truong
(74) Attorney, Agent, or Firm—McDermott Will & Emery LLP

(57) ABSTRACT

The light generating module comprises a housing, a semiconductor light emitting device, a first mounting face, a second mounting face, and a lens. The housing comprises a base and an optical window. The base extends along a predetermined plane and is made from material exhibiting a first thermal conductivity. The semiconductor light emitting device is provided in the housing. The first mounting face is made from material exhibiting a thermal conductivity equal to or more than the first thermal conductivity. The second mounting face mounts the semiconductor light emitting device and is made from material exhibiting a thermal conductivity equal to or more than the first thermal conductivity. The lens is provided in the housing. The lens has an installation face mounted on the first mounting face. The lens is used to direct light from the semiconductor light emitting device toward the optical window.

19 Claims, 20 Drawing Sheets

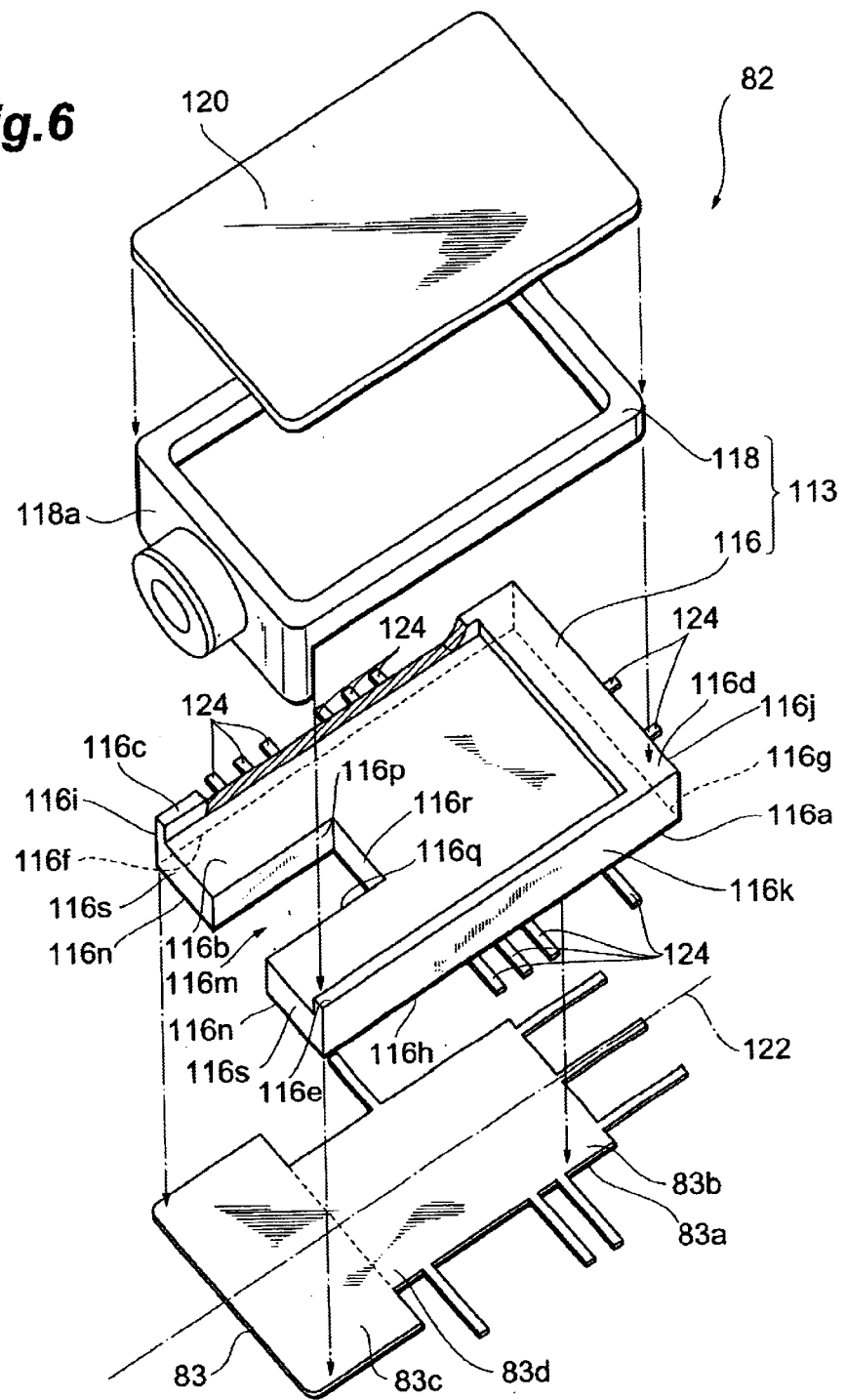

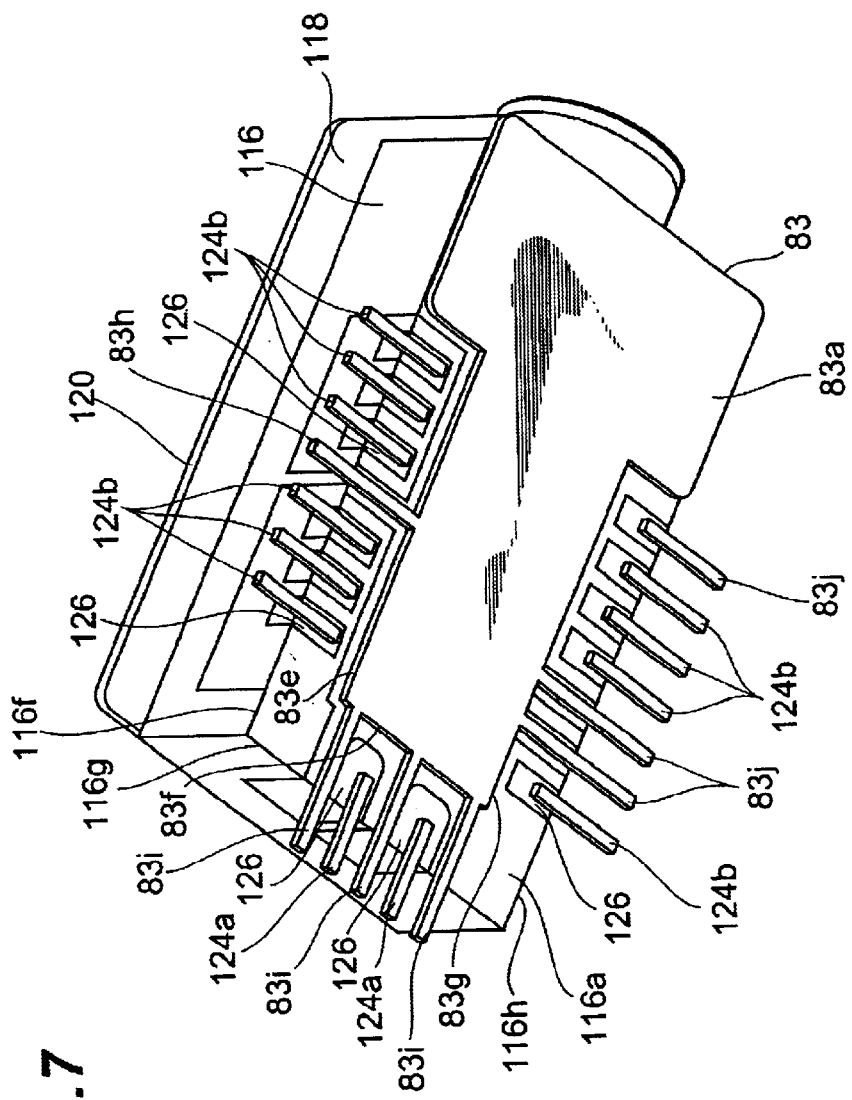

LIGHT GENERATING MODULE

BACKGROUND OF THE INVENTION

1. Field of the Invention

The present invention relates to a light generating module.

2. Description of the Related Art

Document 1 (Japanese Patent Application (Kokai) No. H5-323165) describes a light generating module in which a lens for providing an optical fiber with light from a semiconductor light emitting device is secured in a housing by means of a holding member (such as an "L carrier"). Specifically, a light generating module uses a metal frame and a lens secured thereto, and this secured lens is aligned with the L carrier and then the metal frame is welded by YAG laser within the housing.

SUMMARY OF THE INVENTION

In light generating modules that employ an L carrier, there are a number of restrictions that hinder further miniaturization of the light generating module as follows: a restriction on the outer diameter of the metal frame that holds the lens; a restriction on an area for the use of welding the L carrier by YAG laser. More particularly, these limitations hinder the miniaturization in the height direction of the light generating module.

It is therefore an object of the present invention to provide a light generating module having a structure that permits miniaturization of the height thereof.

One aspect of the present invention relates to a light generating module. The light generating module comprises a housing, a semiconductor light emitting device, a first mounting face, a second mounting face, and a lens. The housing comprises a base and an optical window. The base extends along a predetermined plane and is made from material exhibiting a first thermal conductivity. The semiconductor light emitting device is provided in the housing. The first mounting face is made from material exhibiting a thermal conductivity that is equal to or more than the first thermal conductivity. The second mounting face is made from material exhibiting a thermal conductivity equal to or more than the first thermal conductivity. The second mounting face mounts the semiconductor light emitting device. The lens is provided in the housing. The lens also comprises an installation face which is mounted on the first mounting face. The lens is used to provide light from the semiconductor light emitting device to the optical window.

Another aspect of the present invention relates to a method of manufacturing the light generating module. This method comprises a step of: (a) preparing an optical module part, a lens and an optical monitoring device, the optical module part including a semiconductor light emitting device mounted on a first mounting area in a housing, the lens comprising an installation face provided so as to be mountable on the first mounting area in the housing, and the optical monitoring device being provided to monitor light from the semiconductor light emitting device. This method comprises the step of (b) placing the optical monitoring device outside the housing and placing the lens on a second mounting area such that the semiconductor light emitting device is optically coupled to the optical monitoring device via the lens. This method comprises the step of (c) moving the lens on the second mounting area to determine a first position of the lens according to a monitoring signal from the optical monitoring device. This method comprises the step of (d) moving the lens to a second position. This method permits the condensation of light from the semiconductor light emitting device using a single lens.

The distance between the lens located in the first position and the semiconductor light emitting device is shorter than the distance between the lens located in the second position and the semiconductor light emitting device. The lens produces substantially collimated light from light from the semiconductor light emitting device in the first position.

According to the method of the present invention, the lens comprises an opposed face that is opposite to the installation face. In the step of providing the lens on the second mounting face in the housing, the lens is provided on the second mounting area using an assembly tool for holding the opposed face of the lens. The opposed face of the lens is advantageous to move the lens.

According to the method of the present invention, the lens comprises an opposed face that is opposite to the installation face. In the step of determining the first position of the lens, the lens is moved on the second mounting face using the assembly tool for holding the opposed face of the lens. The opposed face of the lens is advantageous in order to move the lens for its positioning.

According to the method of the present invention, in the step of moving the lens to the second position, the second position is shifted with respect to the first position by a predetermined value. After the lens has been shifted by the predetermined value, the lens is located at a position at which the lens can condense light from the semiconductor light emitting device. Then, the lens is located within a region in which the optical fiber may be moved in the optical alignment thereof.

The above object of the present invention, and other objects, features and advantages thereof will become more clearly apparent from the following detailed description of the preferred embodiments of the present invention that is accompanied with references to the attached drawings.

BRIEF DESCRIPTION OF THE DRAWINGS

FIG. 6 shows the constituent components of the housing of the optical module of this embodiment;

FIG. 7 shows the back of the optical module of this embodiment;

DESCRIPTION OF THE PREFERRED EMBODIMENTS

Figure 1A:
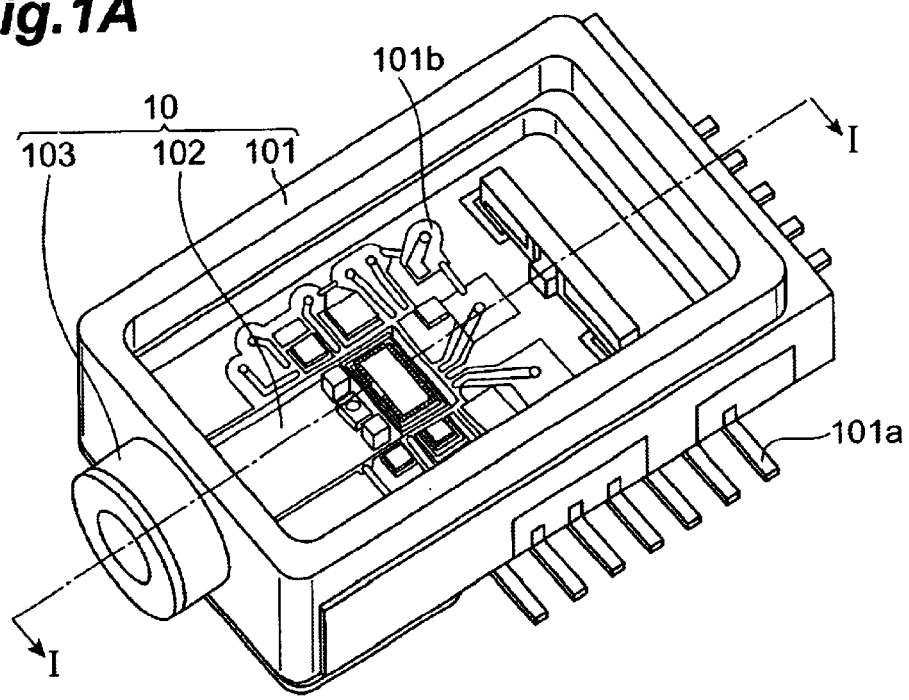
FIG. 1A shows a housing that constitutes a light generating module according to an embodiment of the present invention.

The teachings of the present invention can be easily understood through consideration of the following detailed description which is provided with reference to the attached drawings illustrated as examples. Subsequently, embodiments of the light generating modules of the present invention will be described with reference to the attached drawings. Where possible, the same parts are assigned to the same reference numerals.

(First Embodiment)

Figure 1B:
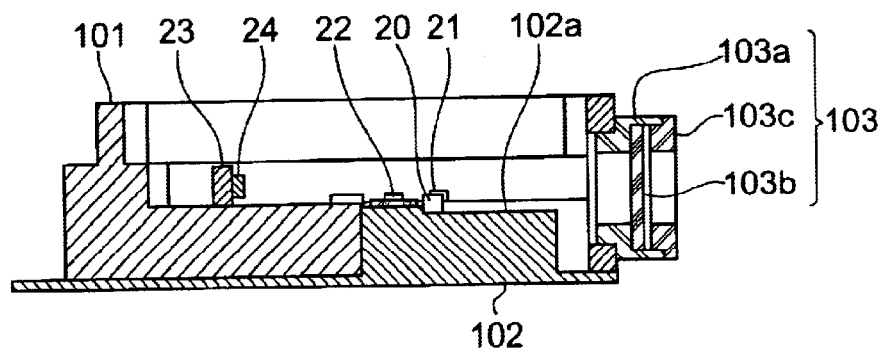
FIG. 1B shows a cross-sectional view taken along line I—I of FIG. 1A.

A description will now be provided for the light generating module 1 according to an embodiment of the present invention with reference to FIGS. 1A and 1B. FIG. 1A shows a housing 10 serving to constitute the optical module 1 according to the embodiment of the present invention. FIG. 1B shows a cross-sectional view taken along line I—I in FIG. 1A. The housing 10 comprises: a Kovar metal frame 101 that constitutes the principal parts of the outer wall and bottom thereof; a mounting portion 102 provided at an opening that is provided in the bottom of the metal frame 101; and a sealing portion 103 that seals the opening provided in the outer wall of the frame 101. The frame 101 comprises an alumina laminated ceramic portion 101b having a wiring pattern, and a plurality of lead pins 101a.

Hermetic glass 103b is brazed using AuGe or AuSn or the like onto a holder 103a to ensure airtightness. A holder 103c is provided to obtain an adequate area of the abutment face to which the holding member (member 106 in FIG. 4) is attached by means of laser welding.

On the mounting face 102a of the mounting portion 102 provided in the housing 10, a semiconductor light emitting device (semiconductor light emitting device portion) 21 is mounted via a chip carrier 20. The semiconductor light emitting device 21 comprises first and second ends and laser light is emitted from the respective ends. The first end faces the hermetic glass 103b of the sealing portion 103 and the second end faces in a direction opposite to the first end. A distributed feed back type (DFB) semiconductor laser, for example, can be employed as this semiconductor light emitting device 21. The semiconductor light emitting device is not limited to a DFB laser, but a Fabry-Perot-type semiconductor laser can be similarly applied thereto. The chip carrier 20 is made of AlN.

The mounting portion 102 mounts an electronic semiconductor element 22 thereon for driving the semiconductor light emitting device 21. The electronic semiconductor element 22 and the semiconductor light device 21 are arranged such that the semiconductor light emitting device 21 is provided between the sealing portion 103 and the electronic semiconductor element 22. This arrangement shortens the distance of electrical connection between the semiconductor light emitting device 21 and the wiring member provided on the laminated ceramic portion 101b, and makes it possible to shorten a distance between the light emitting element and the electronic semiconductor element, and to shorten a distance between the data input portion of the electronic semiconductor element and the conductive patterns of the laminated ceramic portion 101b. The electronic semiconductor element 22 also contains a driver circuit for driving the semiconductor light emitting device 21. The semiconductor light emitting device 21 emits light according to the controlling of the light emitting element in response to a drive signal from the driver circuit.

A photodiode element 24 is mounted via a chip carrier 23 on the laminated ceramic portion 101b. The photodiode element 24 is provided so as to receive laser light emitted by the semiconductor light emitting device 21, and the electronic semiconductor element 22 is provided between the photodiode element 24 and the semiconductor light emitting device 21. The photodiode element 24 has a light receiving sensitivity to a wavelength band including the wavelength of laser light emitted from the second end of the semiconductor light emitting device 21. The drive current to the semiconductor light emitting device 21 may be controlled by using the electronic semiconductor element 22 according to laser light received by the photodiode element 24.

Figure 2A:
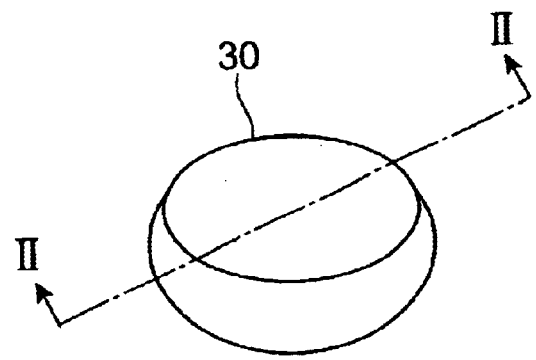
FIG. 2A shows a lens that constitutes the light generating module according to an embodiment of the present invention.
Figure 2B:
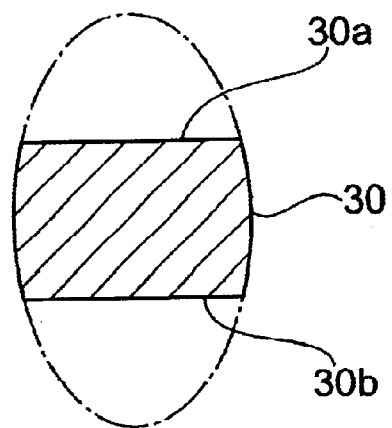
FIG. 2B shows a cross-sectional view taken along line II—II in FIG. 2A.

FIG. 2A shows the lens 30 mounted in the housing 10 to constitute the light generating module 1, and FIG. 2B shows a cross-sectional view taken along line II—II in FIG. 2A. The lens 30 comprises an installation face 30b, an opposed face 30a and a remaining section provided to form a portion, by cutting process, through which light substantially passes. The installation face 30b faces against the mounting face 102a of the housing 10. The opposed face 30a is provided to extend in a direction in which the installation face 30b extends. In this embodiment, the opposed face 30a is parallel with the installation face 30b.

The opposed face 30a of the lens 30 extends along a plane intersecting an axis orthogonal to the installation face 30b. FIG. 2B shows intersecting lines that intersect the outer surface of the lens 30 and a plane containing the optical axis of the lens 30. These intersecting lines extend from the opposed face 30a to the installation face 30b. The radius of curvature of each intersecting line exhibits a first change that is one of increase and decrease as a point on the lens surface moves away from the opposed face 30a, and after an extreme value for the radius of curvature is reached (a maximum value or minimum value), exhibits the other change that is one of increase and decrease as the point nears the installation face 30b. A lens of this kind is known as an aspherical lens. In a preferred embodiment, the opposed face 30a lies parallel with the installation face 30b.

When the lens 30 is mounted on the mounting face 102a of the housing 10, the opposed face 30a is disposed on the mounting face 102a between the semiconductor light emitting device 21 and the sealing portion 103 by means of vacuum chuck or the like. Here, the opposed face 30a may be positioned by aligning the lens with positioning means such as a mark (s), through image recognition, but positioning by means of so-called active alignment can raise the positional accuracy still further. In the present embodiment, the lens 30 is preliminary aligned on the mounting face 102a, a camera is disposed at a position apart by a predetermined distance from the outside of the sealing portion 103 and then the lens 30 is positioned to condense light from the semiconductor light emitting device 21 at a position of the predetermined distance. When the optical fiber is installed in the light generating module 1, the position apart by the predetermined distance corresponds to that of the end of the optical fiber.

The lens 30 is secured on the mounting face 102a using an ultraviolet curing-type resin as the adhesive member. The adhesive member is not limited to such adhesives. For example, with a metal film coated on the installation face 30b thereof, the installation face 30b of the lens 30 is secured to the mounting face 102a with solder for the adhesive member.

Figure 3:
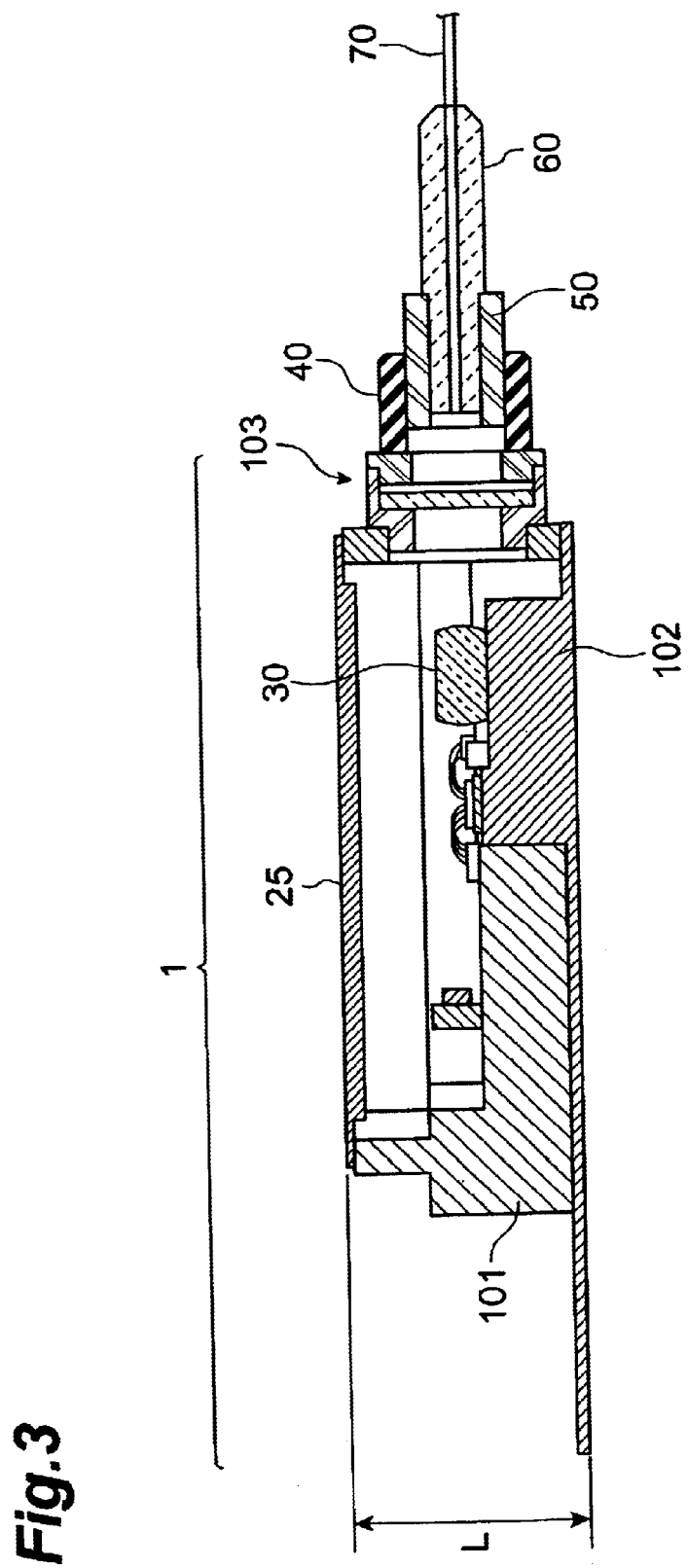
FIG. 3 shows a light generating module according to an embodiment of the present invention.

Subsequently, the light generating module 1, which is constituted by the housing 10 in FIGS. 1A and 1B and the lens 30 in FIGS. 2A and 2B, will be described with reference to FIG. 3. FIG. 3 shows a cross-sectional view showing the light generating module 1.

The lens 30 is secured on the mounting face 102a of the housing 10 by means of the above manner. Electrodes on the semiconductor light emitting device 21 and the electronic semiconductor element 22 are connected by means of bonding wire with the electronic semiconductor element 22 and the wiring member provided on the laminated ceramic portion 101b, respectively. Thereafter, an upper opening of the housing 10 is covered with a Kovar lid 25 to carry out hermetic sealing, thereby forming the light generating module 1.

The light generating module 1 thus formed does not employ a metal frame, L carrier or similar members because the lens 30 is bonded directly to the mounting face 102a. Furthermore, the lens 30 is formed with the opposed face 30a in opposite to the installation face 30b. When the lens 30 is mounted on the mounting face 102a, the opposed face 30a of the lens 30 is in a lower position than the chip carrier 23. Thus, the height L of the light generating module 1 is restricted by dimension determined by the other members that constitute the light generating module 1.

An optical fiber 70 can be attached to the light generating module 1 thus formed. The optical fiber 70 is inserted in and secured to a ferrule 60, and the ferrule 60 is secured by being press-fitted into a bush 50. The bush 50 is disposed so as to be slidable with a sleeve 40 attached to the sealing portion 103 of the light generating module 1. According to such a configuration, the end face of the optical fiber 70 can be optically aligned to be positioned at a predetermined position. In addition, the light generating module 1 may be a receptacle-type light generating module or a pigtail-type light generating module.

The present embodiment describes an example of a light generating module having a single lens, but the present invention can be applied as well to a two lens type light generating module having an additional lens provided outside the housing of the light generating module. The present invention is applicable to a light generating module comprising the semiconductor light emitting device 21 including a plurality of light emitting elements.

The technical advantages of the present embodiment will now be described below. Since the lens 30 comprises a installation face 30b that can be used to be mounted on the mounting face 102a of the housing 10, the lens 30 can be mounted on the mounting face 102a. Since the light generating module 1 does not use a member for holding the lens 30, such as a metal frame or an L carrier, the height L of the light generating module 1 can be reduced as compared with light generating modules having a metal frame or L carrier. More specifically, the outer shape of the metal frame has a minimum dimension on the order of four millimeters (mm), and the height of the L carrier has a dimension on the order of six millimeters (mm) due to requirements on work space for YAG-laser welding and the like. Hence, according to the present embodiment, the restriction from the height of the L carrier can be removed.

Furthermore, because of the lens 30 comprising the opposed face 30a and the installation face 30b, the height of the lens 30 can be reduced in comparison with a lens without the opposed face 30a.

Because the installation face 30b of the lens 30 is secured to the mounting face 102a through an adhesive member, there is no need for an additional member to hold the lens 30. In addition, there is no need for complex processes required to attach the lens 30 to the mounting face 102a.

According to the light generating module of the present embodiment, the lens can be mounted on the mounting face because the lens comprises an installation face used for the mounting thereof on the mounting face. The light generating module of the present embodiment does not include a lens holding member, such as a metal frame or an L carrier, and hence greater flexibility is provided in the designing of light generating modules, for example, whereby the light generating module permits a reduction in the height thereof. It is therefore possible to provide a light generating module having a structure to provide the mounting face for mounting the semiconductor light emitting device thereon without any complex processes and to permit a reduction in its height.

(Second Embodiment)

Figure 4:
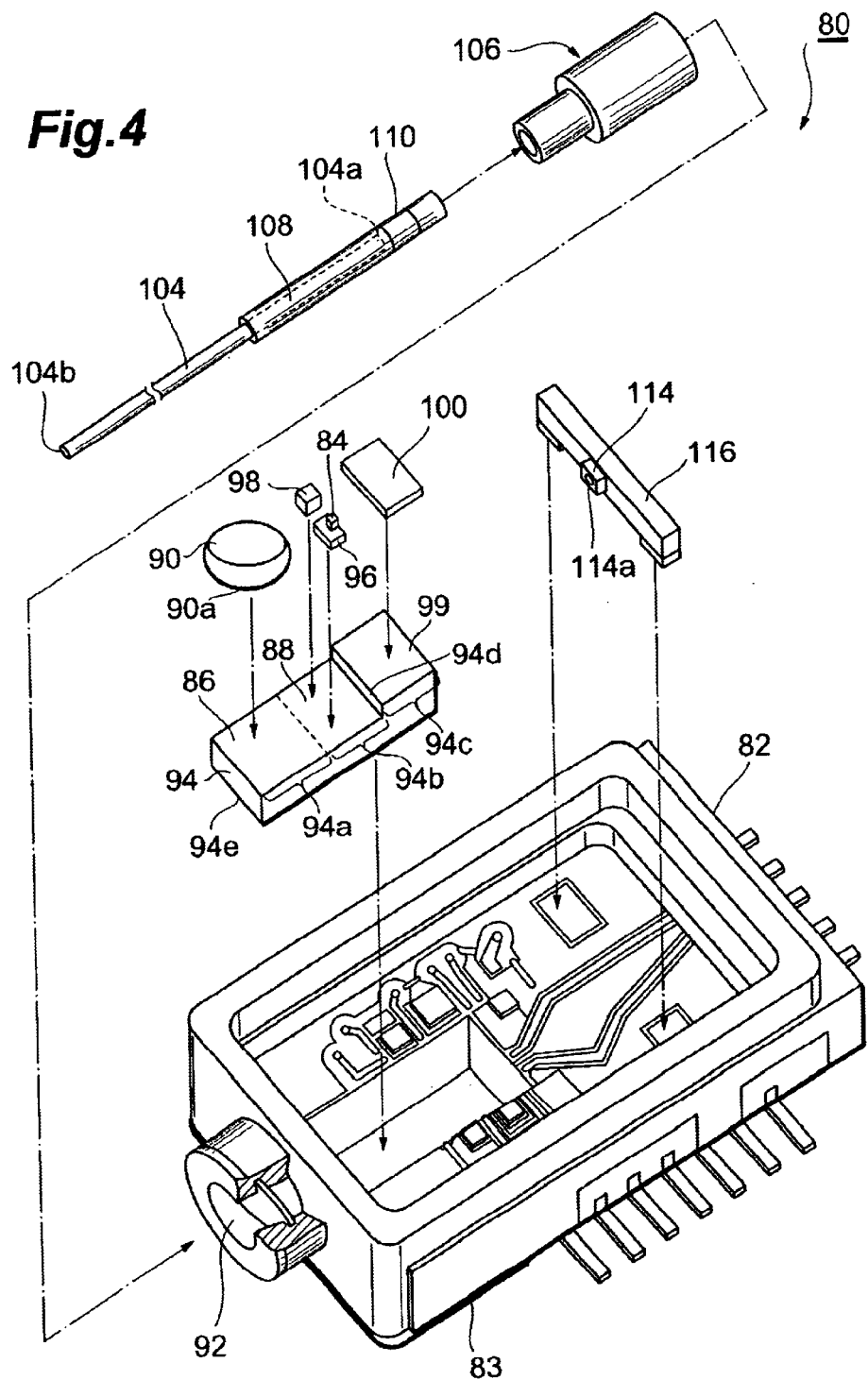
FIG. 4 shows the constituent components of an optical module of another embodiment.
Figure 5A:
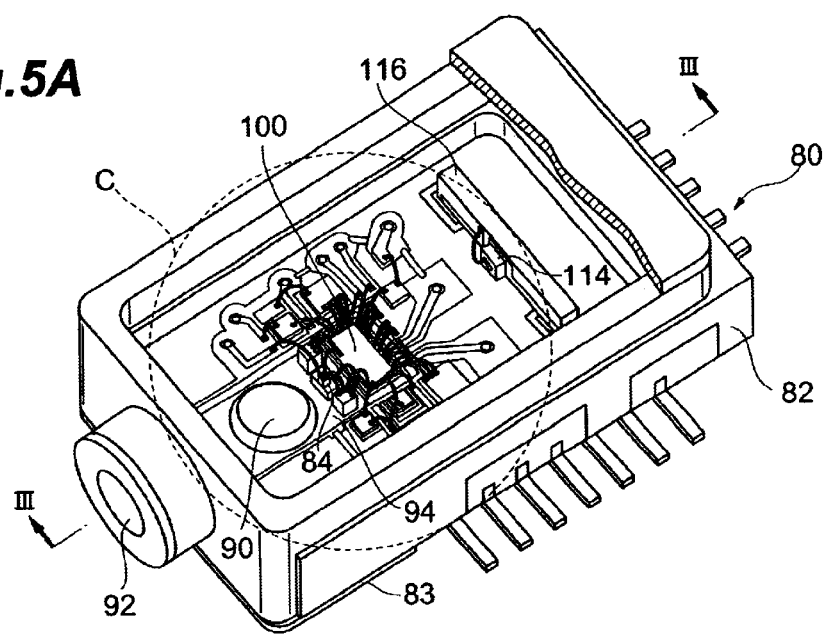
FIG. 5A shows the optical module of the embodiment.
Figure 5B:
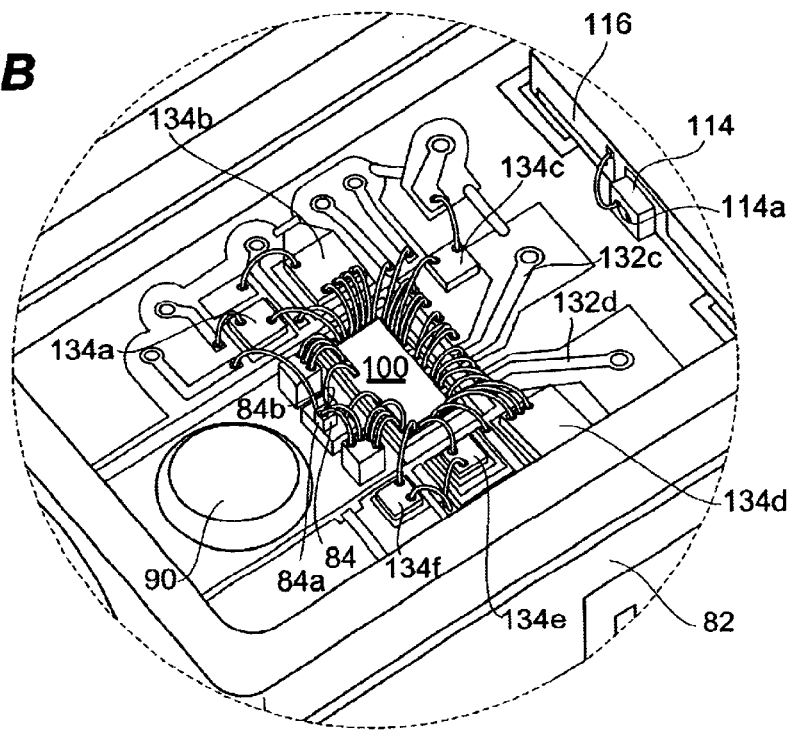
FIG. 5B shows the optical module as shown within the circle depicted in the broken line in FIG. 5A.

FIG. 4 shows the components of an optical module of another embodiment. FIG. 5A shows the optical module of the embodiment. FIG. 5B shows the optical module as shown in a circle of the broken line shown in FIG. 5A.

Referring now to FIGS. 4, 5A and 5B, the optical module 80 comprises a housing 82, a semiconductor light emitting device 84, a first mounting face 86, a second mounting face 88, and a lens 90. The housing 82 comprises a base 83 made from material that exhibits a first thermal conductivity, and an optical window 92. The first mounting face 86 mounts the lens 90 thereon. The second mounting face 88 mounts the semiconductor light emitting device 84 thereon. The lens 90 comprises an installation face 90a for mounting it on the first mounting face 86, and is used to guide light from the semiconductor light emitting device 84 to the optical window 92.

In the optical module 80, the first mounting face 86 is made from material that exhibits a thermal conductivity equal to or more than that of the first thermal conductivity of the base 83. The second mounting face 88 is made from material that exhibits a thermal conductivity equal to or more than that of the first thermal conductivity. The first mounting face 86 and the second mounting face 88 can constitute the mounting face. The base 83 of the housing 82 is preferably made from a metallic material, such as Kovar or copper tungsten, and the base 83 of the housing 82 can be made from a ceramic material, such as alumina ceramic. The first mounting face 86 and the second mounting face 88 are preferably made from an electrically conductive material or insulating material that exhibits high thermal conductivity, such as copper tungsten, aluminum nitride, or silicon carbide (SiC). From the prospective of the dissipation of heat generated by electronic components in the optical module 80, it is preferable, in the optical module 80, that the thermal conductivity of material constituting the first mounting face 86 should exceed the first thermal conductivity and that the thermal conductivity of the material constituting the second mounting face 88 should exceed the first thermal conductivity. The experiments conducted by the inventors have found that alumina ceramic material can practically be used for the base 83 of the housing 82 if a member providing the mounting faces 86 and 88 has a sufficiently large volume and a sufficiently high thermal conductivity. When alumina ceramic is used for the base 83 of the housing 82, the laminated ceramic portion and a side wall members, described later in addition to the base 83, can be made by the same manufacturing process and integrally formed. Alternatively, after individually manufacturing the base 83 of the housing 82, the laminated ceramic portion and so forth from alumina ceramic, they are bonded through brazing members.

According to the optical module 80, the lens 90 comprises an installation face 90a provided to be mounted on the first mounting face 86, so that the lens 90 can be mounted on the first mounting face 86 and the lens 90 can be positioned on the first mounting face 86. The semiconductor light emitting device 84 is mounted on the second mounting face 88, and hence the heat dissipation is favorable. Since the first and second mounting faces 86 and 88 are constituted from material exhibiting a thermal conductivity equal to or more than the first thermal conductivity, the lens serving to guide light from the semiconductor light emitting device is aligned to the optical window and the semiconductor light emitting device is provided with its favorable heat dissipation. Further, it is hard for heat from the semiconductor light emitting device to reach the lens because the first and second mounting faces are both constituted from material of an excellent thermal conductivity.

The optical module 80 may further comprise a mounting member 94. The mounting member 94 works as a mounting portion, for example. The mounting member 94 is provided on the base 83. Heat from the semiconductor light emitting device 84 is dissipated via the mounting member 94 and the base 83. The mounting member 94 comprises first to third regions 94a to 94c arranged in a predetermined axial direction. The first region 94a comprises the first mounting face 86 and the lens 90 is mounted therein. The second region 94b comprises the second mounting face 88 and the semiconductor light emitting device 84 is mounted therein. A mounting part 96, such as a heat sink, is provided between the semiconductor light emitting device 84 and the mounting member 94. The mounting part 96 is used for the dissipation of heat from the semiconductor light emitting device 84 and for the positioning of the semiconductor light emitting device 84 in a direction of the height thereof. The second region 94b is capable of mounting an electronic component 98 thereon. Examples for the electronic component 98 are a capacitor, such as a chip capacitor, and a wiring component, such as a wiring post. The electronic component 98 is disposed in the vicinity of the semiconductor light emitting device 84 and is used for the high-speed operation of the semiconductor light emitting device 84.

The optical module 80 may further comprise a driver element 100 that is mounted on the mounting member 94 and electrically connected to the semiconductor light emitting device 84. The third region 94c mounts the driver element 100 thereon. The driver element 100 and the semiconductor light emitting device 84 are arranged on the mounting member 94 and therefore the driver element 100 and the semiconductor light emitting device 84 can be positioned close to one another. Heat from the driver element 100 is dissipated via the mounting member 94 and the base 83. The mounting member 94 comprises a third mounting face 99, a step 94d provided between the second mounting face 88 and the third mounting face 99, and an installation face 94e. The mounting member 94 is provided in the housing 82 such that the installation face 94e faces the base 83. The distance (height) between the second mounting face 88 and installation face 94e of the mounting member 94 is shorter than the distance (height) between the third mounting face 99 and the installation face 94a. The difference in height between the second mounting face 88 and the third mounting face 99 separated therefrom by the step 94d is useful to position the driver element 100 and the semiconductor light emitting device 84, thereby shortening the length of a wire to connect the driver element 100 and the semiconductor light emitting device 84.

The optical module 80 may further comprise an optical fiber 104 that receives light from the semiconductor light emitting device 84 via the optical window 92. The optical fiber 104 is held by a ferrule 108. The optical module 80 comprises a holding member 106 for holding the ferrule 108. The holding member 106 my be a metal member, for example, and is secured to the housing 82 with the holding member 106 aligned on the housing 82. The ferrule 108 holds the optical fiber 104. The holding member 106 holds the ferrule 108 and, if necessary, the holding member 106 can hold an optical isolator 110. The optical fiber 104 has a first end 104a and a second end 104b. The first end 104a receives light from the lens 90 via the optical window 92. The optical fiber 104 is used to transmit light from the first end 104a thereof to the second end 104b.

According to the optical module 80, the optical window 92 can be hermetically sealed. The semiconductor light emitting device 84 can be optically coupled to the optical fiber 104 through the single lens 90 provided between the optical fiber 104 and the semiconductor light emitting device 84. The lens 90 acts to condense light from the light emission face of the semiconductor light emitting device 84 on the first end 104a of the optical fiber 104. There are a number of advantages in a single lens type configuration. First of all, the optical module can be miniaturized because the number of constituent parts of the optical module can be made smaller. Because of the smaller number of the constituent parts, costs for parts of the optical module can be reduced. In addition, because of the smaller number of the constituent parts, the assembly time is shortened. For example, with a two-lens configuration, it takes much time in the optical alignment of a lens provided in the vicinity of the optical fiber, so the benefit of this time reduction is therefore substantial.

The optical module 80 may further comprise a monitoring light receiving element 114 that is optically coupled to the semiconductor light emitting device 84. The monitoring light receiving element 114 is provided in a fourth region when the cavity in the housing 82 is divided into first to fourth regions which are arranged in a predetermined axial direction. The lens 90 is provided in the first region, the semiconductor light emitting device 84 is provided in the second region, and the driver element 100 is provided in the third region. The monitoring light receiving element 114 receives light from the second end face of the semiconductor light emitting device 84. This light passes over the driver element 100 to reach the monitoring light receiving element 114. The lens 90 receives light from the first end face of the semiconductor light emitting device 84. This configuration makes it possible to dispose the driver element 100 neighboring upon the semiconductor light emitting device 84 and to monitor the backlight of the semiconductor light emitting device 84. The monitoring light receiving element 114 is provided on a mounting part 111, and the light receiving face 114*a* of the monitoring light receiving element 114 faces the back face of the semiconductor light emitting device 84. The light receiving face 114*a* of the monitoring light receiving element 114 is oriented so that light from the back face of the semiconductor light emitting device 84 does not return to the semiconductor light emitting device 84.

FIG. 5B shows the interior of the optical module 80 in detail. The semiconductor light emitting device 84 comprises a pair of end faces 84*a* and 84*b*. The end face 84*a* faces the lens 90 and is optically coupled to the lens 90. The end face 84*b* faces the light receiving element 114 and is optically coupled to the light receiving element 114.

FIG. 6 shows the constituent parts of the housing of the optical module according to this embodiment. FIG. 7 shows the back side of the optical module according to this embodiment. The structure of the housing will now be described with reference to FIGS. 6 and 7. The housing 82 comprises a base 83, a frame 113, and a lid 120. The frame 113 comprises a first side wall member 116 and a second side wall member 118. The first side wall member 116 and the second side wall member 118 are arranged on a base 83. This arrangement provides a cavity for housing optical components, such as the lens 90, and electronic components, such as the semiconductor light emitting device and the driver element. The lid 120 covers the second side wall member 118 and can seal the cavity thereby. The base 83 comprises an outer bottom face 83*a*, which is provided so that the optical module 80 can be mounted on a substrate having a flat face, and an inner bottom face 83*b*, which is provided so as to mount the mounting member 94 and the first side wall member 116 thereon. In a preferred embodiment, the material of the base 83 is an electrically conductive material.

The first side wall member 116 comprises a wiring face 116*b* opposed to aback side 116*a*. Here, the first side wall member 116 is outlined below and will be described with reference to FIG. 8. The first side wall member 116 provides the housing 82 with side walls 116*c*, 116*d* and 116*e*. The side walls 116*c*, 116*d* and 116*e* comprise outside walls 116*i*, 116*j* and 116*k* that extend from three edges 116*f*, 116*g*, and 116*h* of the first side wall member 116. The first side wall member 116 comprises an opening 116*m*. The opening 116*m* is provided so as to extend in the direction of the axis 122 and from an edge 116*n* of the first side wall member 116. In this embodiment, the opening 116*m* is provided by side walls 116*p* and 116*q* that extend in the direction of the axis 122 and by a side wall 116*r* that extends in a direction intersecting the axis 122. When the first side wall member 116 is provided on the base 83, the inner bottom face 83*b* in the base 83 is exposed at the position of the opening 116*m* of the first sidewall member 116. The mounting member 94 is provided in the opening 116*m* of the first side wall member 116.

The first side wall member 116 comprises a front face 116*s* that extends along a plane intersecting the axis 122. The second side wall member 118 is positioned on the base 83 and the first side wall member 116 so as to make contact on the side walls 116*c*, 116*d*, and 116*e* and the front face 116*s*. This positioning forms the frame 113. In the frame 113, an optical window (reference numeral 92 in FIG. 5A), is provided at the front wall 118*a* of the second side wall member 118 and is positioned with respect to the opening 116*m* of the first side wall member 116. The second side wall member 118 comprises an upper face for mounting the lid 120 thereon. The lid 120 is disposed on the upper face of the second side wall member 118. In a preferred embodiment, the material of the second side wall member 118 and the lid 120 is metal, so that this material permits the hermetic sealing between the second side wall member 118 and the lid 120.

The optical module 80 comprises an optical fiber 104 for receiving light from the semiconductor light emitting device 84 via the optical window 92. The optical fiber 104 is optical aligned on the second side wall member 118, made of metal, and thus held by the holding member 106, made of metal. The optical alignment of the optical fiber 104 is implemented by use of the holding member 106 and the side wall member 118.

The base 83 and the first side wall member 116 will now be described with reference to FIGS. 6 and 7. The base 83 comprises first and second portions 83*c* and 83*d* arranged in the direction of the axis 122. The width of the first portion 83*c* (the length in a direction intersecting the axis 122) is larger than the width of the second portion 83*d*. The width of the first portion 83*c* is substantially the same as the lateral width of the housing 82 and, by virtue of this shape, the base 83 can support the side wall members 116 and 118. The width of the second part 83*d* is determined such that the back side 116*a* of the side wall member 116 is exposed. Because of this exposure, the lead terminals 124, which are connected to the electrodes 126 on the back side 116*a* of the side wall member 116, do not make contact with the base 83. Edges 83*e*, 83*f*, and 83*g* of the second portion 83*d* of the base 83 are inwardly separated from the edges 116*f*, 116*g* and 116*h* of the bottom face 116*a* of the side wall member 116, so that edges 83*e*, 83*f*, and 83*g* do not make contact with the electrodes provided on the back side 116*a* of the first side wall member 116. The second portion 83*d* of the base portion 83 comprises base lead terminals 83*h*, 83*i* and 83*j* that extend in a direction in which the lead terminals 124*a* and 124*b* extends, respectively. These base lead terminals 83*h*, 83*i*, and 83*j* are used to apply a predetermined electric potential, such as a ground potential, to the base 83. The lead terminals 124*a* and 124*b* and the base lead terminals 83*h*, 83*i*, and 83*j* protrude outward from the respective sides of the first side wall member 116.

Figure 8:
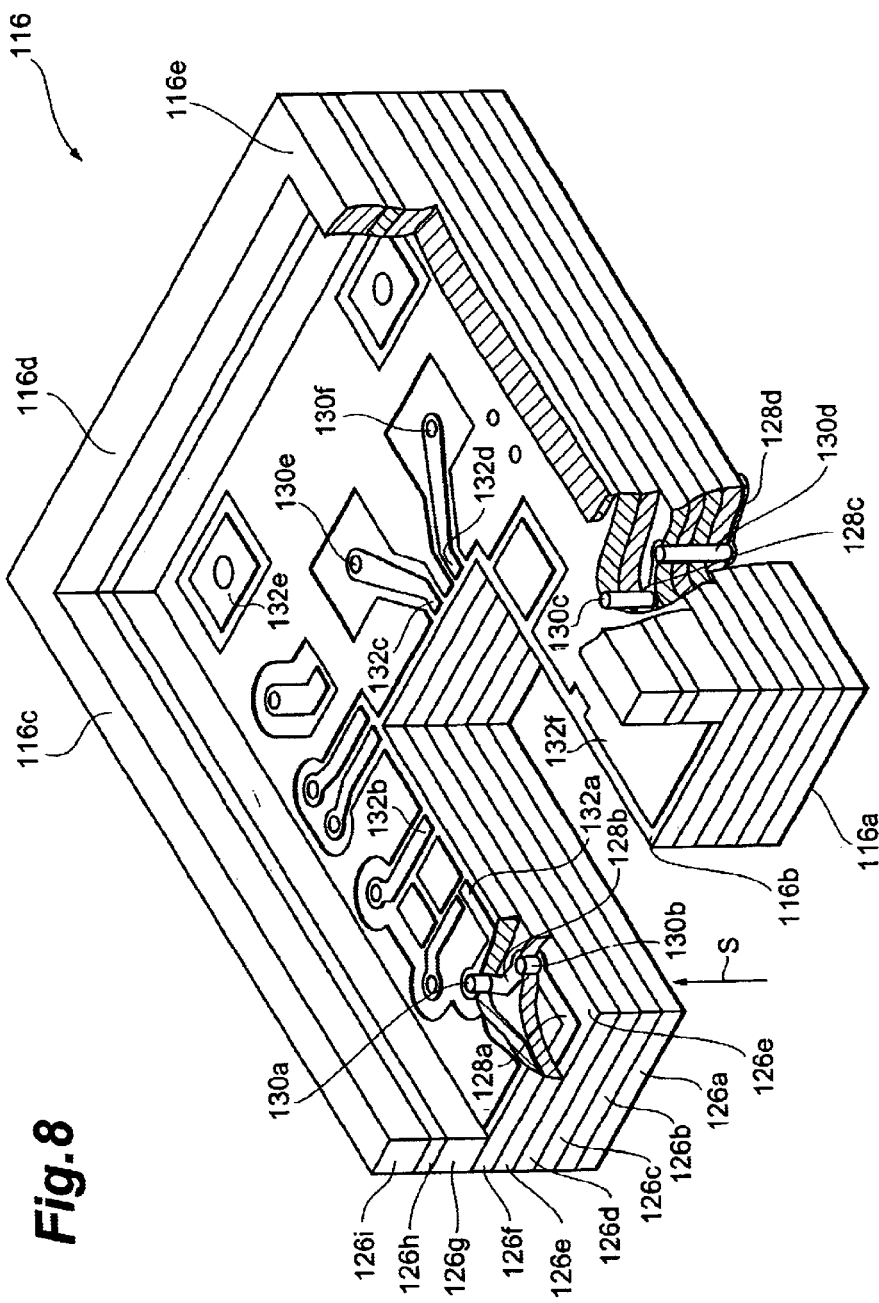
FIG. 8 shows a first side wall member shown in FIG. 6.

FIG. 8 shows the first side wall member as shown in FIG. 6. The first side wall member 116 comprises a plurality of insulation layers 126*a* to 126*f* and 126*g* to 126*i* sequentially provided in a direction S from the back side 116*a* toward the wiring face 116*b*. One face of the insulation layer 126*a* is able to constitute the back side 116*a* of the first side wall member 116. One surface of the insulation layer 126*f* is able to constitute the wiring face 116*b* of the first side wall member 116. The plurality of insulation layers 126*g* to 126*i* constitute the side walls 116*c*, 116*d*, and 116*e* of the first side wall member 116. In a preferred embodiment, the insulation layers are made from a ceramic material, such as alumina, and it is thus possible to manufacture the first side wall member 116 in a method of forming ceramic circuit substrates. The first side wall member 116 comprises a plurality of electrically conductive layers 128*a* to 128*d* with each other. Each of the electrically conductive layers 128*a* to 128*d* is provided between two layers of the insulation layers 126*a* to 126*f*. The first side wall member 116 comprises wiring pads 132*a* to 132*f* provided on the wiring face 116*b*. The first side wall member 116 comprises vias 130*a* to 130*f* which serve to connect the wiring pads 132*a* to 132*f* and the electrically conductive layers 128a to 128d. In the first side wall member 116, the following elements are electrically connected via the electrically conductive layers 128a to 128d, the vias 130a to 130f, and the wiring layers 132a to 132f; the electronic components (the electronic components 134a to 134f shown in FIG. 5B) and light receiving element 114 which are mounted on the wiring face 116b; the semiconductor light emitting device 84 and driver element 100 mounted on the mounting member 94 located between the wall portion 116c and the side wall 116e; and the lead terminals 124a and 124b. Since the first side wall member 116 comprises the plurality of insulation layers and the plurality of wiring pads, electronic components, such as the monitoring light receiving element 114, can be connected to one another via the conductive layers and wiring layers. With the first side wall member 116, there is no need for a separate wiring substrate for electrically connecting electronic components in the light generating module, such as the semiconductor light emitting device, the driver element and the monitoring light receiving element to one another.

The first side wall member 116 comprises multiple insulation layers and electrically conductive patterns provided between these insulation layers, so that it is possible to implement transmission lines (microstrip lines, striplines, for example) serving to transmit high frequency electrical signals in order to realize transmission speeds of 10 Gbit per second (Gbps) or more. In the present embodiment, signals for driving the semiconductor light emitting device 84 are, for example, inputted via the pair of lead terminals 124a. The lead terminals 124a are electrically connected to a pair of wiring pads 132c and 132d via the electrically conductive layers and the vias 130e and 130f in the first side wall member 116. As shown in FIG. 5B, the wiring pads 132c and 132d are connected to the driver element 100 via connecting members, such as bonding wires. Referring now to FIG. 7, base lead terminals 83i neighbors the lead terminals 124a on both sides thereof. The base lead terminals 83i are electrically connected to the base 83, thereby supplying a stable electric potential, such as a ground potential. Consequently, this housing 82 has a structure preferable to implement a small-sized optical module for processing high frequency signals.

Figure 9A:
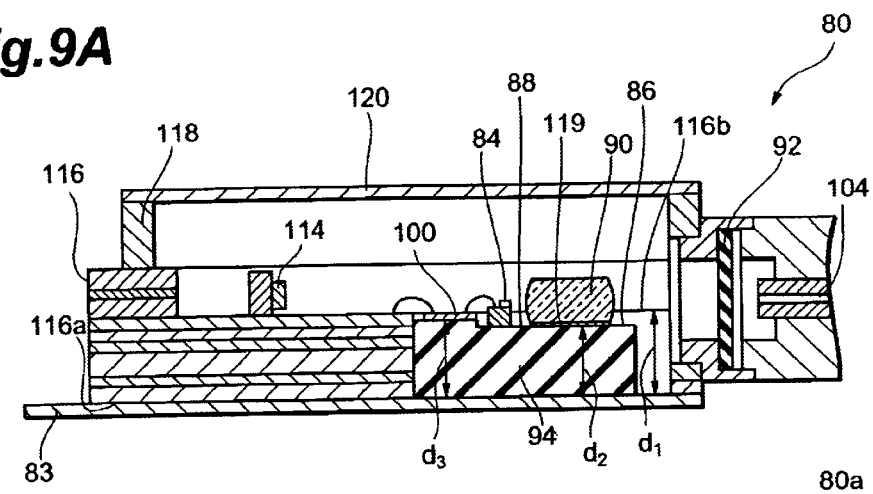
FIG. 9A is a cross-sectional view taken along line III—III shown in FIG. 5A.

FIG. 9A is a cross-sectional view taken along the line III—III shown in FIG. 5A. In the optical module 80, the mounting member 94 is provided on the base 83. A distance $d_2$ between the base 83 and the first mounting face 86 of the mounting member 94 is shorter than a distance $d_1$ between the base 83 and the wiring face 116b of the side wall member 116, thereby making it easier to optically align the lens 90 and the optical fiber 104 with each other. Further, the distance 42 between the base 83 and the first face 86 of the mounting member 94 is shorter than a distance $d_3$ between the base 83 and the third face 99 of the mounting member 94. This difference ($d_3$–$d_2$) forms the step 94d of the mounting member 94. Since the height of the semiconductor light emitting device 84 and the height of the driver element 100 can be adjusted by this step 94d, the length of the wiring connecting the semiconductor light emitting device 84 and the driver element 100 with each other can be shortened. Moreover, the distance $d_3$ between the base 83 and the third face 99 of the mounting member 94 is shorter than the distance $d_1$ between the base 83 and the wiring face 116a of the side wall member 116. Since the height of the wiring face 116b is different from the height of the driver element 100 by this difference ($d_1$–$d_3$), the length of the wiring connecting the wiring face 116b and the driver element 100 with each other can be shortened. The installation face 90b of the lens 90 is secured via an adhesive member 119 to the first mounting face 86. In a preferred embodiment, the adhesive member 119 comprises a UV curing agent. With the UV-curing adhesive member, the lens 90 can be aligned and secured in a straightforward manner. Since welding is not used to secure the lens 90, there is no distortion caused by welding in the metals. Furthermore, therein no need for the lens holding member, made of metal, as required for welding.

Figure 9B:
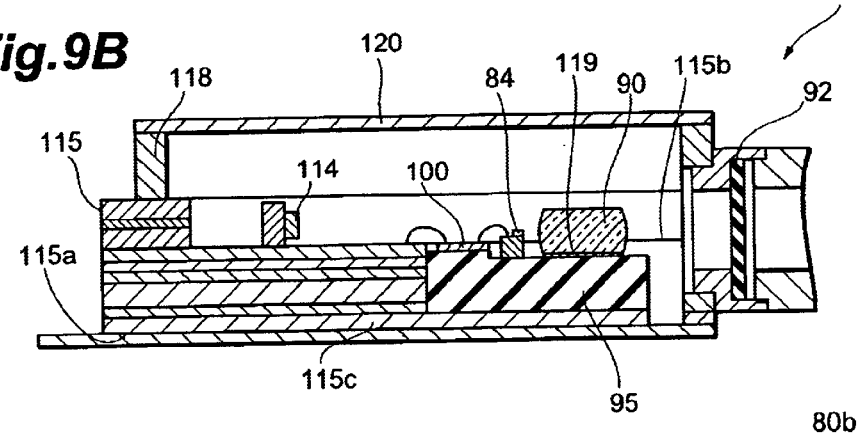
FIG. 9B is a cross-sectional view taken along a line equivalent to line III—III according to a modification of an optical module.

FIG. 9B is a cross-sectional view, taken along a line equivalent to the line III—III, showing a modified example of an optical module. Referring now to FIG. 9B, an optical module 80a is shown. The optical module 80a comprises a side wall member 115 in place of the side wall member 116. The side wall member 115 comprises a back side 115a and a wiring face 115b. In the optical module 80a, the lowermost insulation layer 115c of the side wall member 115 is provided between a mounting member 95 and the base 83. The side wall member 115 has a shape that is obtained by disposing the side wall member 116 on the insulation layer 115c provided on the upper face of the base 83. The height of the mounting member 95 is lower than the height of the mounting member 94 and differs by the thickness of the insulation layer 115c. In the optical module 80a, the base 83 and the mounting member 95 can be electrically isolated from each other even when the mounting member 95 exhibits electrical conductivity. An electric potential can be supplied to the mounting member 95 via an electrical conductive layer of the side wall member 115 because the insulation layer 115c is provided integrally with the side wall member 115.

Figure 9C:
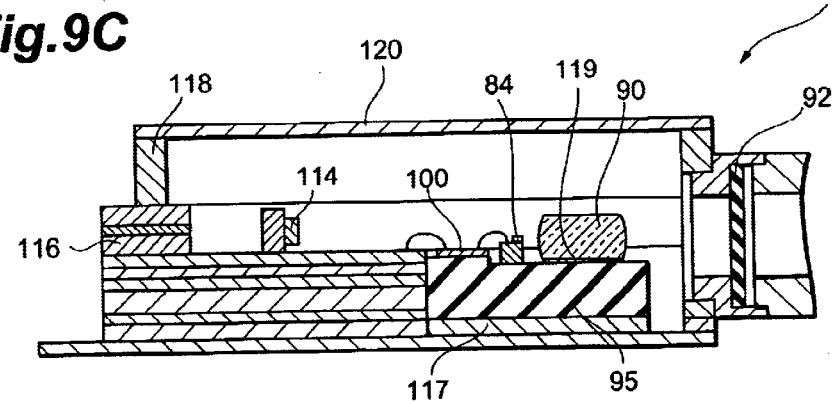
FIG. 9C is a cross-sectional view taken along a line equivalent to line III—III according to a modification of an optical module.

FIG. 9C is a cross-sectional view, taken along a line equivalent to the line III—III, showing a modification of an optical module. Referring now to FIG. 9C, an optical module 80b is shown. In the optical module 80b, an insulation layer 117 is provided between the mounting member 95 and the base 83. The insulation layer 117 is provided so as to cover the upper face of the base 83. In a preferred embodiment, the material of the insulation layer 117 is the same as that of the insulator of the side wall member 116 or exhibits a thermal conductivity superior to the thermal conductivity of the material of the base 83, such as Aluminum nitride (AlN). The height of the mounting member 95 is lower than the height of the mounting member 94 and differs by the thickness of the insulation layer 117. In the optical module 80b, the base 83 and the mounting member 95 can be electrically isolated from each other even when the mounting member 95 exhibits electrical conductivity. The optical module 80b exhibits excellent dissipation of heat from the mounting member 95.

Figure 10:
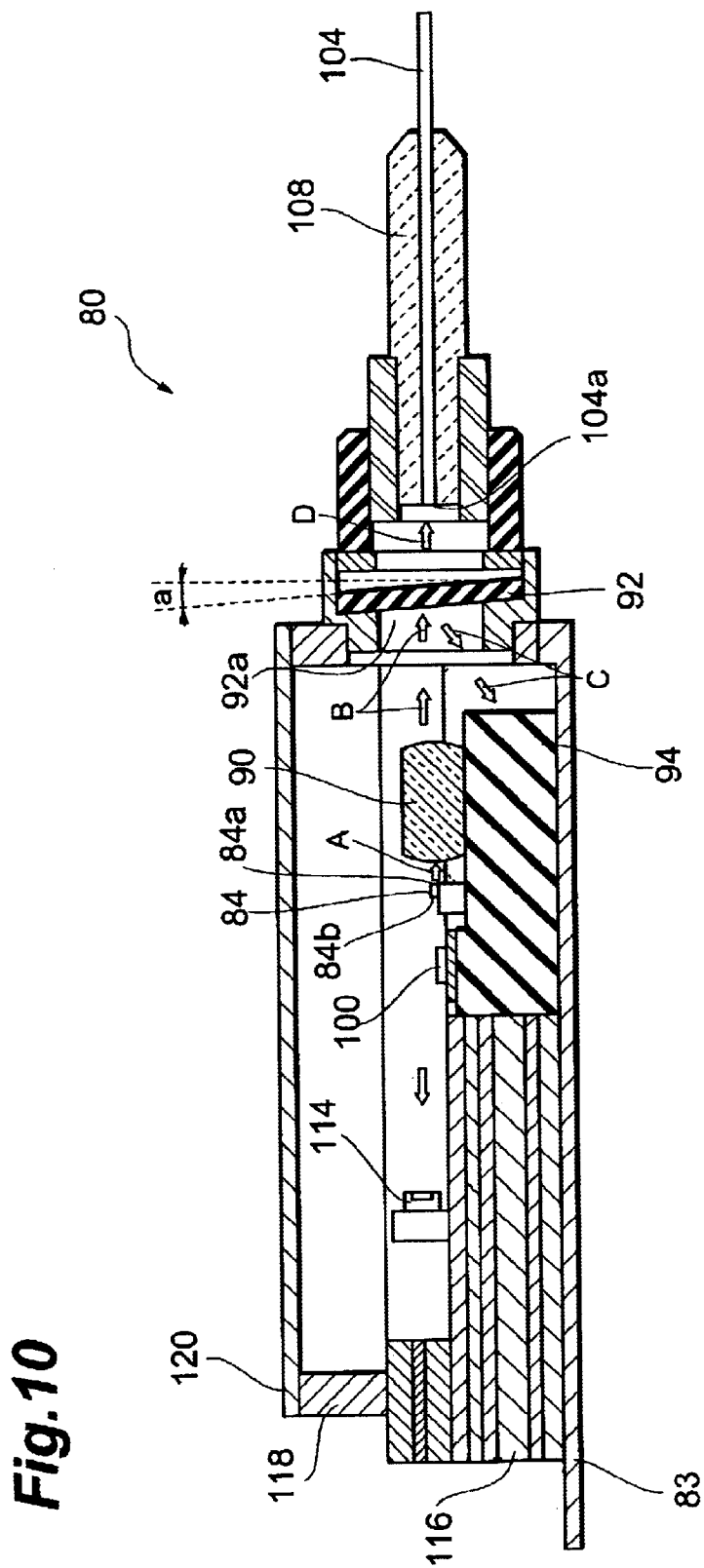
FIG. 10 shows an optical coupling of the optical module.

FIG. 10 shows an optical coupling of the optical module. In the optical module 80, light A from the first end face 84a of the semiconductor light emitting device 84 enters the lens 90. The lens 90 converts the divergent light A into condensed light B. Light B enters the optical window 92. At the light incident face 92a of the optical window 92, some of the incident light B is reflected to form reflected light C, and the remaining light is transmitted to form light D. Transmitted light D enters the end 104a of the optical fiber 104.

In the optical module 80, the distance between the position of the lens 90 and the position of the semiconductor light emitting device 84 mounted is greater than the distance between the position of the semiconductor light emitting device 84 and the position of the lens 90 capable of converting light from the semiconductor light emitting device 84 into collimated light. With the optical module 80, the semiconductor light emitting device 84 can be optically coupled to the optical fiber 104 through the single lens 90 provided between the optical fiber 104 and the semiconductor light emitting device 84.

In the optical module 80, the optical window 92 comprises a light incident face 92a. The reflected light C reflected by the light incident face 92a travels toward the bottom face of the housing 82 because the light incident face 92a extends along a plane that intersects another predetermined plane, extending in a direction of the extension of the base 83, at an angle greater than zero degrees and less than 90 degrees (a in FIG. 10), for example eight degrees. Although the reflected light C may be multiply reflected by the inner walls of the housing 82, it does not return the semiconductor light emitting device 84 and enter light receiving element 114. The preferred range of the angle is equal to or more than 2 degrees and equal to or less than 45 degrees, and is desirably on the order of 8 degrees or equal to or less than 8 degrees. If the angle of inclination of the light incident face 92a is equal to or more than 2 degrees, the amount of light returning to the semiconductor light emitting device is reduced. If the angle of inclination is equal to or less than 8 degrees, the amount of light returning to the semiconductor light emitting device can be reduced and an incremental dimension of the housing is permitted which results from this inclination. An angle of inclination on the order of 45 degrees is considered to be a upper value.

Figure 11A:
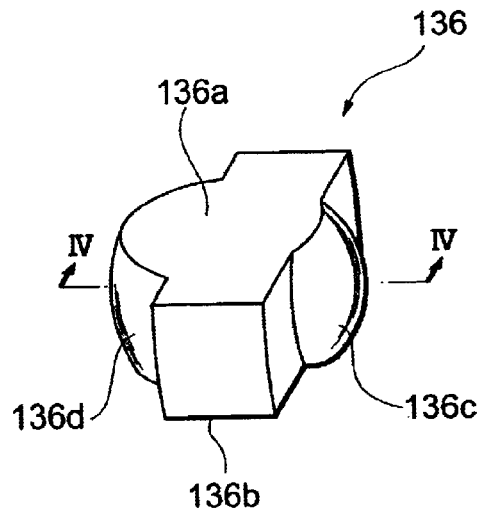
FIGS. 11A and 11B show some modifications of the lens.
Figure 11B:
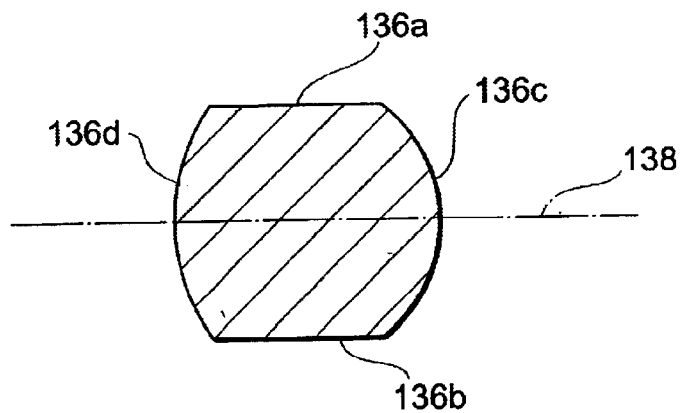

FIGS. 11A and 11B show a modified example of the lens. Referring now to FIG. 11A, a lens 136 is shown. Similarly to the lenses 30 and 90, the lens 136 comprises an opposed face 136a and an installation face 136b. The opposed face 136a of the lens 136 extends along a plane intersecting an axis orthogonal to the installation face 136b. The provision of the opposed face 136a and the installation face 136b makes it possible to reduce the height of the lens, whereby the height of the optical module can be reduced. FIG. 11B shows a cross-sectional view taken along the line IV—IV in FIG. 11A. Referring now to FIG. 11B, intersecting lines are shown. The intersecting lines are intersections of a plane containing the center axis of the lens 136 and the outer faces of the lens 136. These intersecting lines extend from the edge of the opposed face 136a to the edge of the installation face 136b. At the face 136c, one line of the intersecting lines has the radius of curvature exhibiting a first change that is one of increase and decrease as a point on the face 136c moves away from the opposed face 136a, and after an extreme value (a maximum value or minimum value) for the radius of curvature is reached, then exhibiting another change that is one of increase and decrease as the point nears the installation face 136b. At the face 136d, the other of the intersecting lines has the radius of curvature exhibiting a first change that is one of increase and decrease as a point on the face 136d moves away from the opposed face 136a, and after an extreme value (a maximum value or minimum value) for the radius of curvature is reached, then exhibiting another change that is one of increase and decrease while the point nears the installation face 136b. A lens of this kind is known as an aspherical lens. With an aspherical lens, light from the semiconductor light emitting device can be condensed efficiently.

Figure 11C:
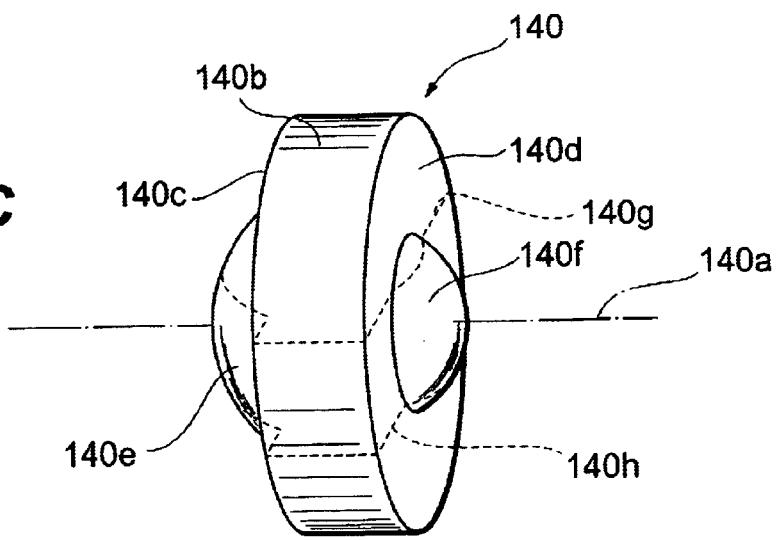
FIG. 11C shows a method of manufacturing the lens.

FIG. 11C shows the method of manufacturing the lens. A lens workpiece 140 comprises a columnar section 140b that extends along the center axis 140a. This columnar section 140b comprises a pair of faces 140c and 140d extending in a direction intersecting the center axis 140a. On the first face 140c, a protrusion 140e having a curved face is provided. The protrusion 140e has rotational symmetry about the center axis 140a. On the second face 140d, a protrusion 140f having a curved face is provided. The protrusion 140f has rotational symmetry about the center axis 140a. A lens 136 is formed by cutting the lens workpiece 140 in planes defined by the intersection of the lens workpiece 140 and a pair of planes 140g and 140h, the planes 140g and 140h intersecting a plane which contains the center axis 140a. The center axis 140a is provided between the plane 140g and the plane 140h.

Figure 12:
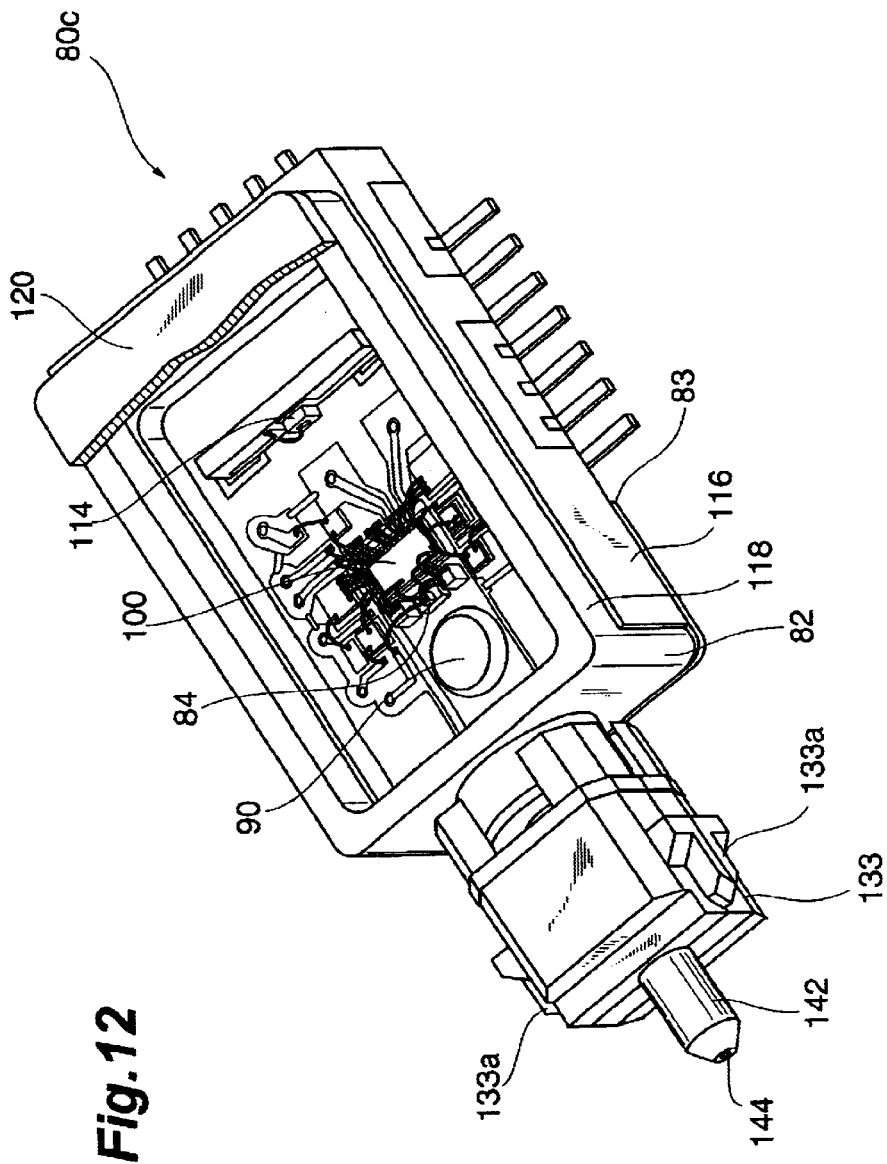
FIG. 12 shows another modification of the optical module.

FIG. 12 shows another modified example of the optical module. Referring now to FIG. 12, an optical module 80c is shown. The optical module 80c comprises, in place of the pigtail fiber 104, a receptacle 133 which can be mated with an optical connector. The receptacle 133 holds a ferrule 142 extending in a direction of the predetermined axis. The ferrule 142 holds an optical fiber 144 therein. One end of the ferrule 142 protrudes from the receptacle 133 and one end of the optical fiber 144 appears at one end of the ferrule 142. The other end of the optical fiber 144 held by the ferrule 142 receives light from the semiconductor light emitting device 84 via the optical window 92. The receptacle 133 comprises protrusions 133a capable of mating with an optical connector.

(Third Embodiment)

FIGS. 13 to 17 show the method of manufacturing an optical module. A coordinate system is shown in each of FIGS. 13 to 17.

Figure 13:
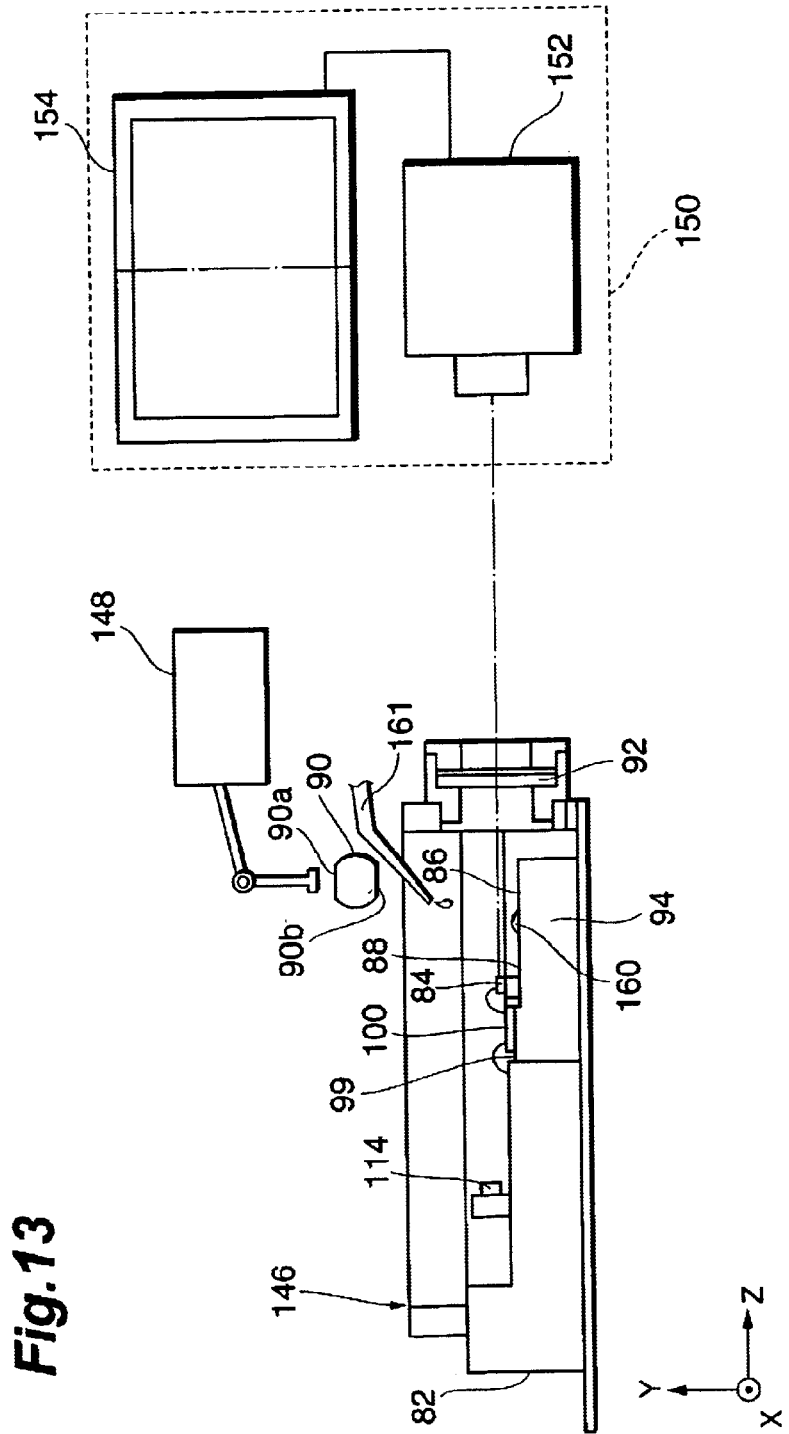
FIG. 13 shows a method for manufacturing an optical module.

As shown in FIG. 13, the lens 90, a workpiece 146 of the optical module, and optical monitoring device 150 are prepared. The workpiece 146 is assembled such that the semiconductor light emitting device 84 is capable of emitting light. The semiconductor light emitting device 84 is mounted on the second mounting face 88. The optical monitoring device 150 is used to monitor light from the semiconductor light emitting device 84. The optical monitoring device 150 shown by way of example comprises an image generating device 152, which receives light from the semiconductor light emitting device 84, and a display 154 for displaying an image from the image generating device 152. The image generating device 152 is disposed at a predetermined distance apart from the workpiece 146, for example, at a distance on the order of fifty centimeters. Further, an assembly tool, such as a vacuum chuck device 148, is prepared in order to handle the lens 90. Before the lens 90 is disposed on the second mounting face 86, an adhesive member 160 containing an ultraviolet curing agent is provided on the mounting face 86. The adhesive member 160 is supplied to the mounting face 86 using a supply tool 161. The lens 90 is provided on the adhesive member 160 in a later manufacturing step.

Figure 14:
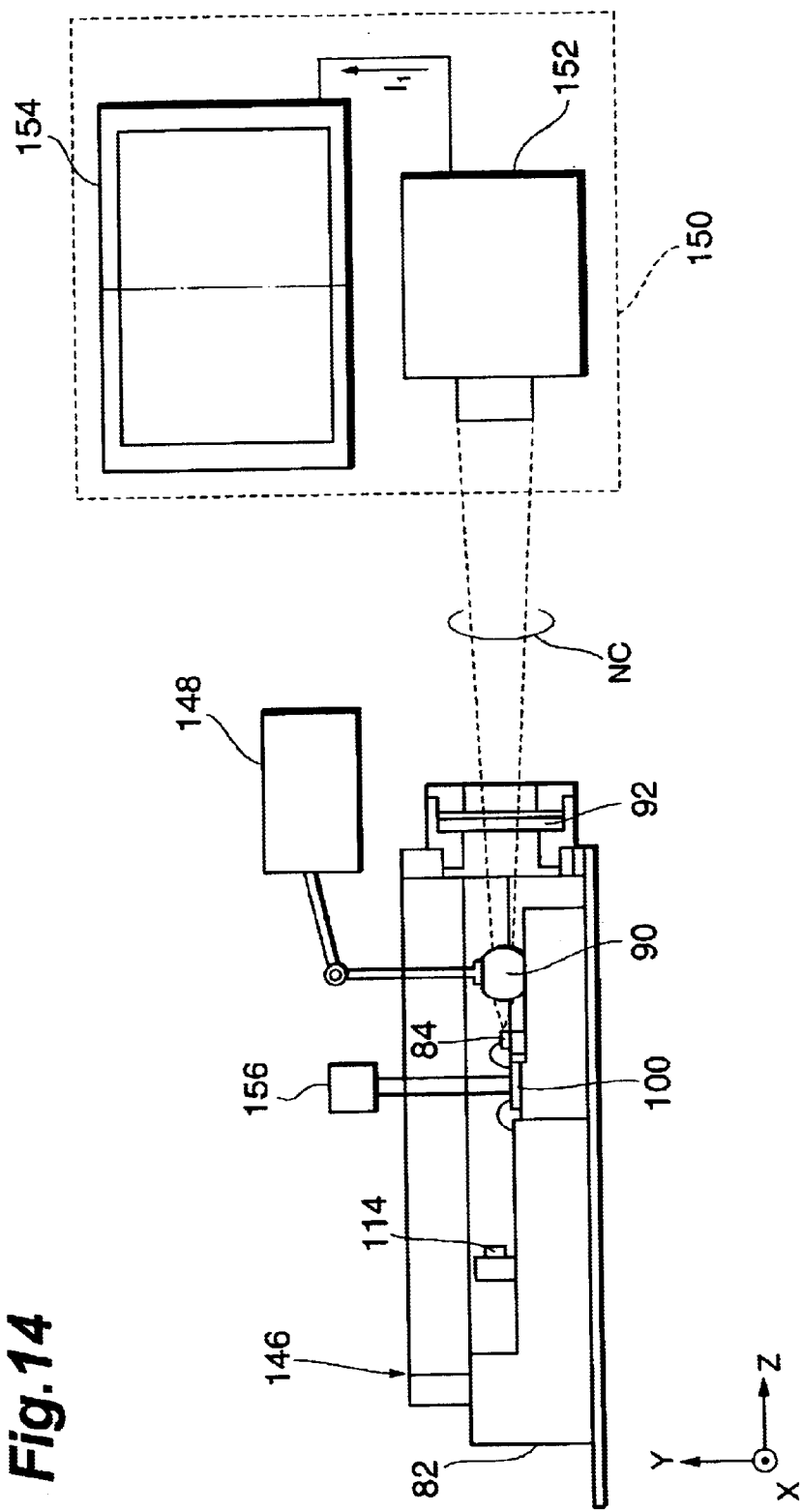
FIG. 14 shows a method for manufacturing an optical module.

Next, as shown in FIG. 14, the optical monitoring device 150 is placed outside the housing 82, and the lens 90 is provided on the second mounting face 86 so that the semiconductor light emitting device 84 is optically coupled to the optical monitoring device 150 via the lens 90. Consequently, the optical monitoring device 150 and the workpiece 146 are arranged in the direction of Z axis. The vacuum chuck device 148 is attached to the opposed face 90b of the lens 90 to move the lens 90 onto the first mounting face 86. A power source 156 is connected to the workpiece 146 so that electrical power can be supplied to the semiconductor light emitting device 84 of the workpiece 146. The lens 90 can be moved on the first mounting face 86 using the vacuum chuck device 148 in X axis direction and Z axis direction.

Figure 15:
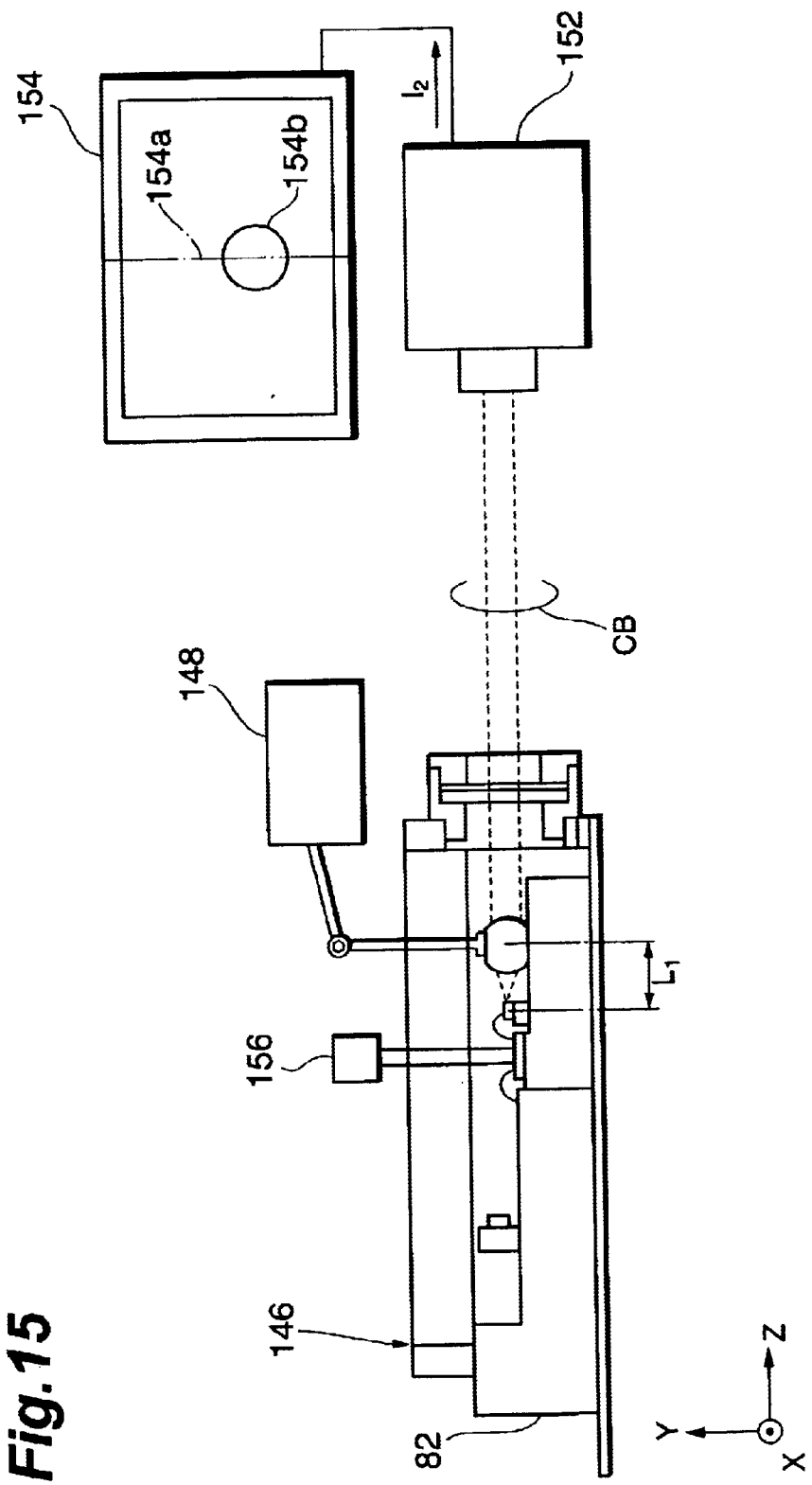
FIG. 15 shows a method for manufacturing an optical module.

The lens 90 is then moved in the X axis direction and the Z axis direction on the first mounting face 86 to establish the first position of the lens according to a monitoring signal $I_1$, from the optical monitoring device 150. The monitoring signal $I_1$ indicates that the light beam NC from the semiconductor light emitting device 84 is not collimated. As shown in FIG. 15, the reference line 154a and the light beam image 154b are displayed on the screen of the display 154. In order to determine the first position, the lens 90 is moved such that the light beam image 154b is positioned at a predetermined position with respect to the reference line 154a. At the first position, the light beam CB from the semiconductor light emitting device 84 is substantially collimated, and the image generating device 152 generates a monitoring signal $I_2$. The monitoring signal $I_2$ indicates that the light beam from the semiconductor light emitting device 84 is collimated. After the lens has been moved, the area of the light beam image on the display of the optical monitoring device 152 becomes smaller. In a preferred embodiment, the first position is established such that the area of the light beam image on the optical monitoring device 152 is substantially at a minimum. At this position (collimation position), the interval between the semiconductor light emitting device 84 and the lens 90 is indicated by the symbol $L_1$.

Figure 16:
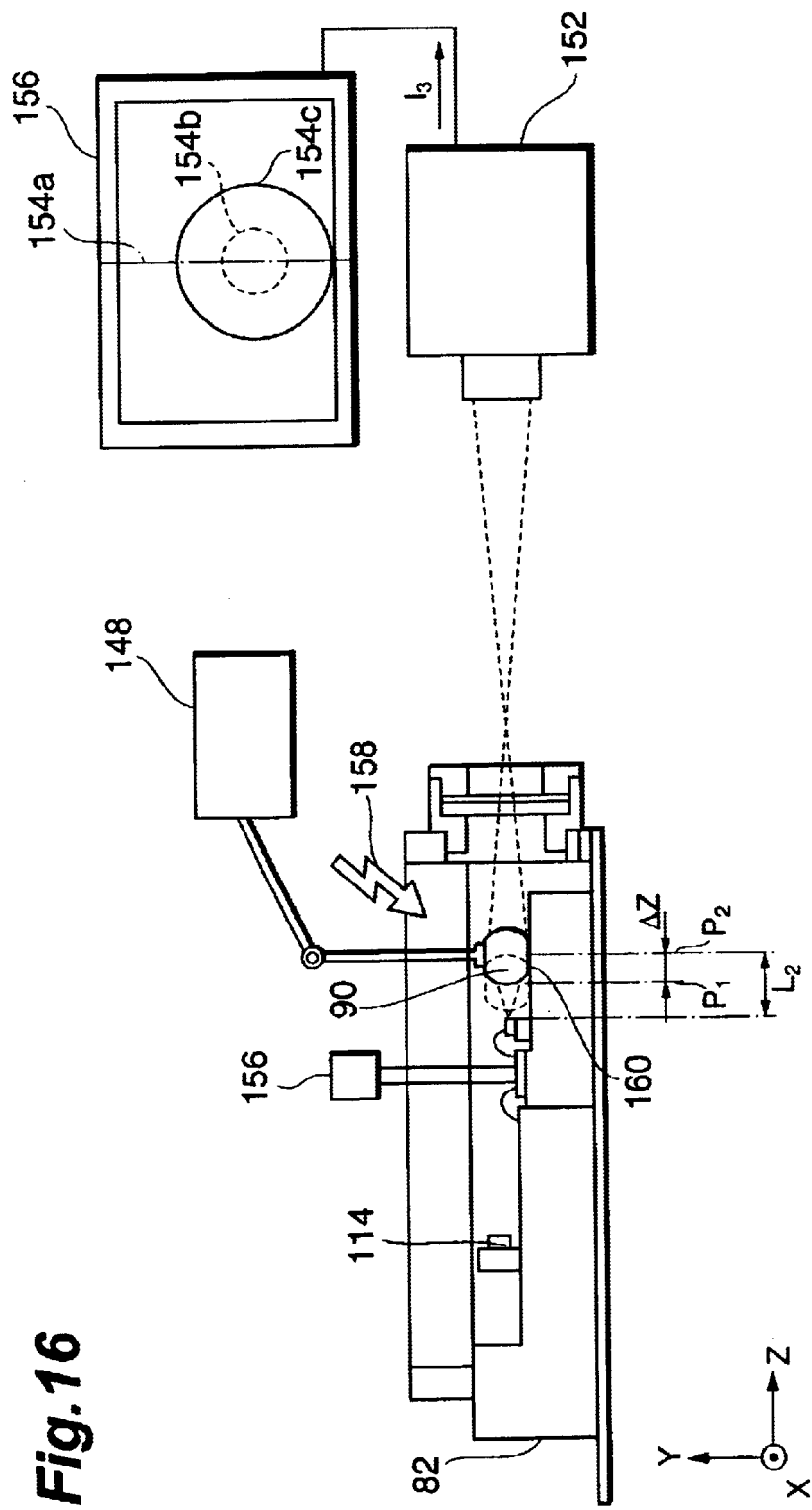
FIG. 16 shows a method for manufacturing an optical module.

After the first position has been determined, the lens 90 is moved to a second position by use of the vacuum chuck device 148. As shown in FIG. 16, the distance between the lens 90 at the first position $P_1$ and the semiconductor light emitting device 84 is shorter than the distance between the lens 90 at the second position $P_2$ and the semiconductor light emitting device 84. The image generating device 152 generates a monitoring signal $I_3$. The monitoring signal $I_3$ indicates that the lens 90 has been shifted from the position at which the light beam from the semiconductor light emitting device 84 is collimated. In the step of moving the lens 90 to the second position, the lens 90 is moved toward the optical window 92. After this movement, the lens 90 at the second position is capable of condensing light from the semiconductor light emitting device 84. This position lies in a region within which the optical fiber can move during the optical alignment of the optical fiber. This manufacturing method can determine the position of the lens 90 that condenses light from the semiconductor light emitting device 84 using the single lens 90. The distance between the first position $P_1$ and the second position $P_2$ is expressed by symbol $\Delta Z$. In the position of lens 90 (shifted position), the interval between the semiconductor light emitting device 84 and the lens 90 is indicated by the symbol $L_2$. The distance $L_1$ is less than the distance $L_2$ ($L_2 > L_1$). In an example, $L_1$ is on the order of 0.2 millimeters to 2 millimeters and the interval between the image generating device 152 and the lens is on the order of 50 centimeters. Hence, the lens is disposed at a substantial collimation position by adjusting the lens position such that the area of the beam spot on the image display is substantially at a minimum. After the collimation position of the lens has been established, the lens 90 is moved by a predetermined value $\Delta Z$ in a direction of the Z axis (in the direction from the semiconductor light emitting device 84 toward the optical window 92). Thereupon, the beam image on the image display 156 increases in size to fade (depending on the size of the image display device 156, the image exceeds the displaying range). The predetermined value, symbol $\Delta Z$, is a fixed value designed in a design step.

The position of the lens 90 is kept in the second position, the adhesive member 160 containing an ultraviolet curing agent is provided beforehand on the mounting face 86, and light 158 including ultraviolet light for the adhesive member 160 irradiates the lens 90 to harden the ultraviolet curing agent of the adhesive member 160. This hardening completes the positioning of the lens 90. The lens 90 in this position condenses light from the semiconductor light emitting device in the positional range in which the optical fiber 104 may move during the alignment of the optical fiber 104.

Figure 17:
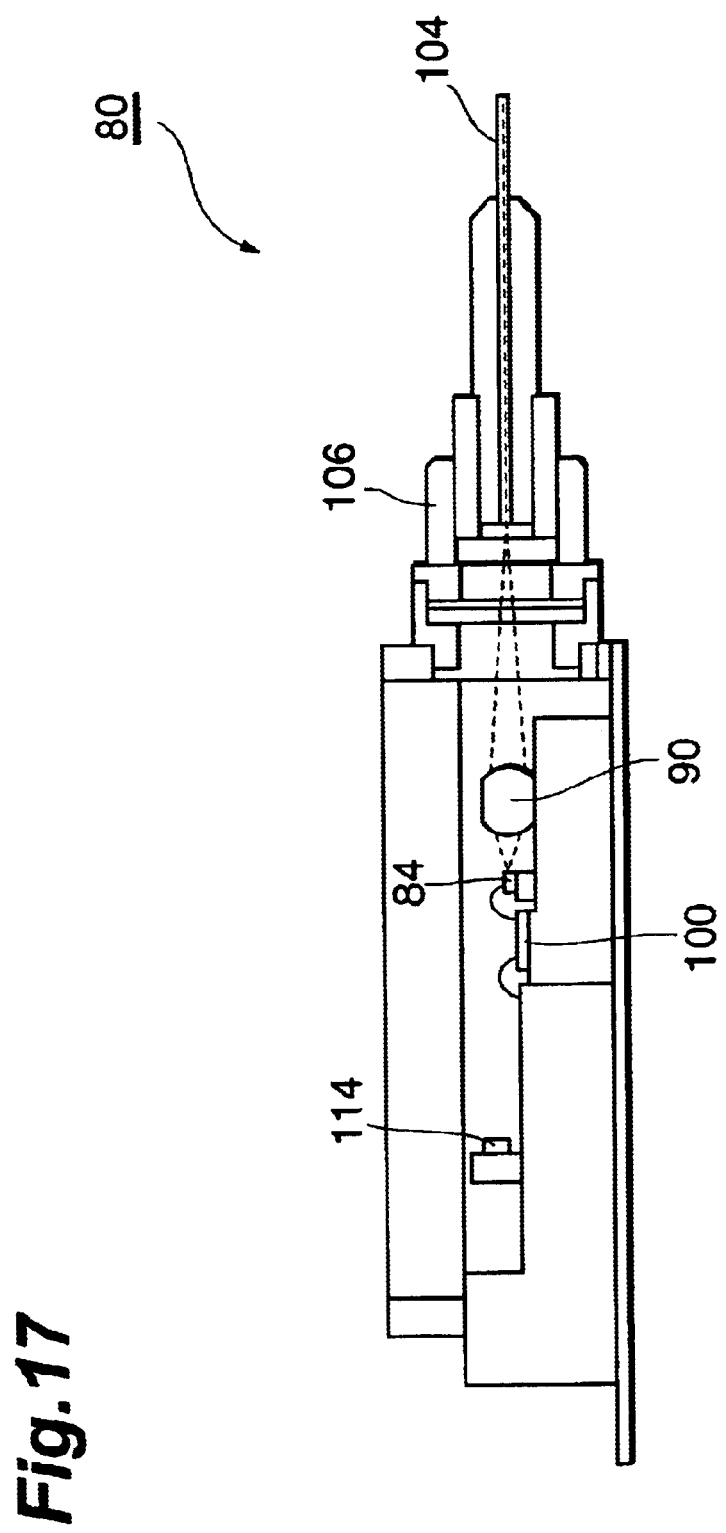
FIG. 17 shows a method for manufacturing an optical module.

As shown in FIG. 17, after the optical fiber 104 has been aligned, the holding member 106 and the bush (reference numeral 50 in FIG. 3) are secured (positioning in the direction of the Z axis), and then the holding member 106 is secured to the side wall member 118 (positioning in the direction of the X and Y axes). The optical module 80 is finished by means of these principal steps.

Figure 18:
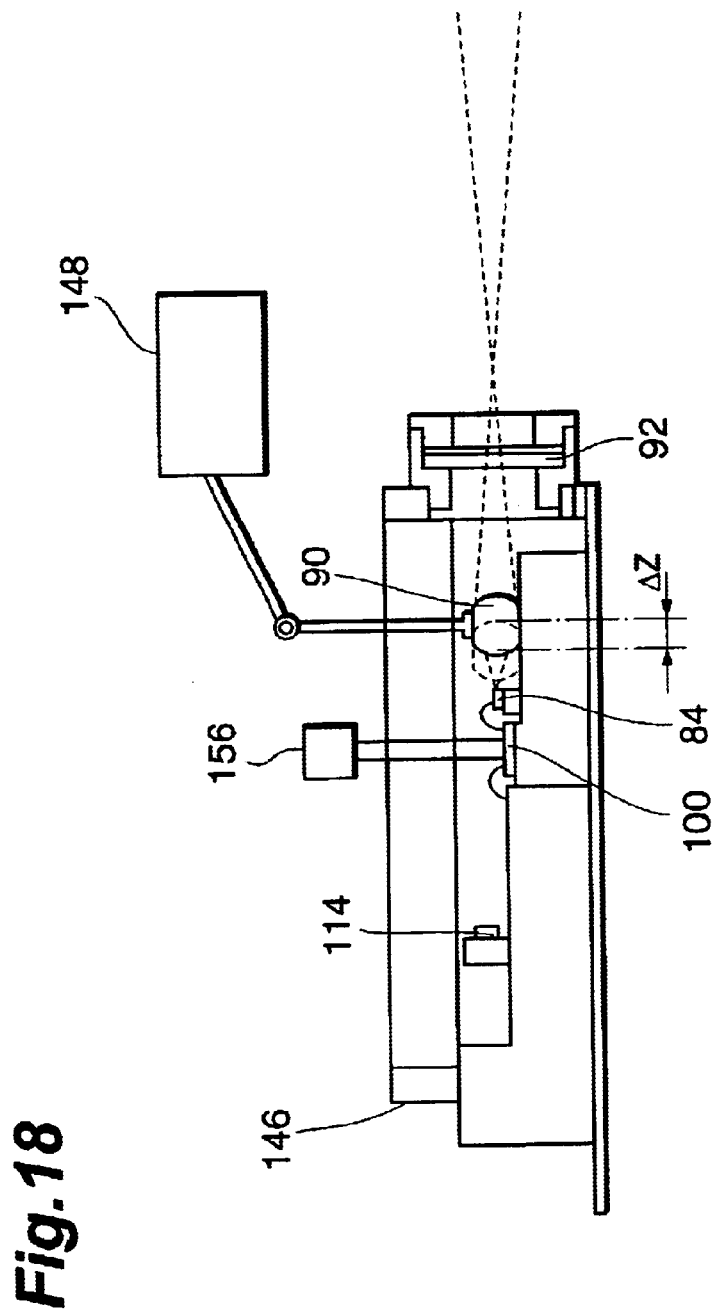
FIG. 18 shows a modification of a method of manufacturing an optical module.

FIG. 18 shows a modified example of the method of manufacturing the optical module. In the method of this modified example, in the step of moving the lens 90 to the second position, the second position is shifted by the predetermined value $\Delta Z$ with respect to the first position. This shift involves shifting the position of the lens 90 by a predetermined value without using an optical monitoring device. In the shifted position, the lens 90 is capable of condensing light from the semiconductor light emitting device 84. In this position, the area of the light beam image is expected to be substantially minimal.

(Fourth Embodiment)

Figure 19:
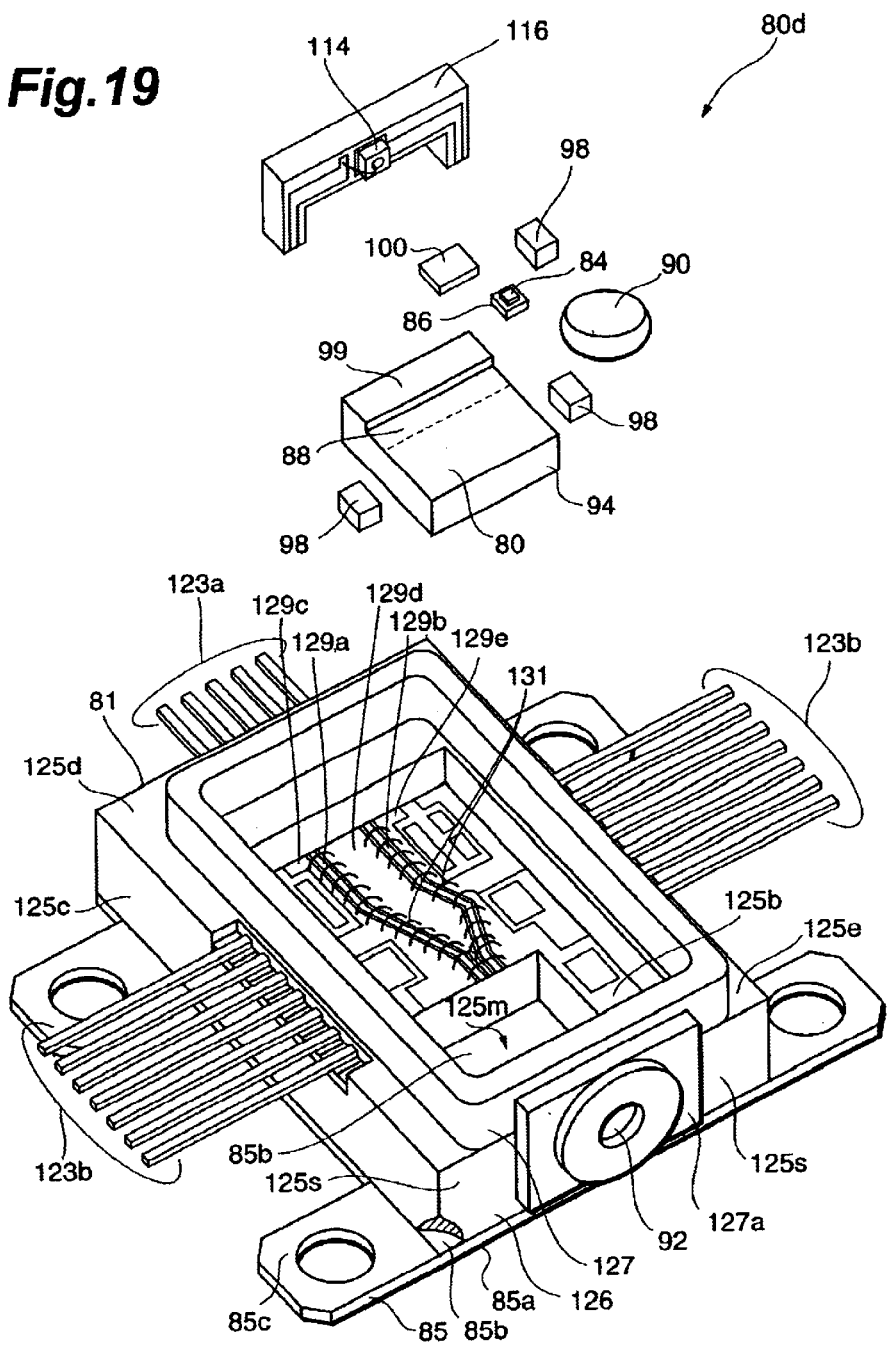
FIG. 19 shows the constituent components of an optical module of yet another embodiment.
Figure 20:
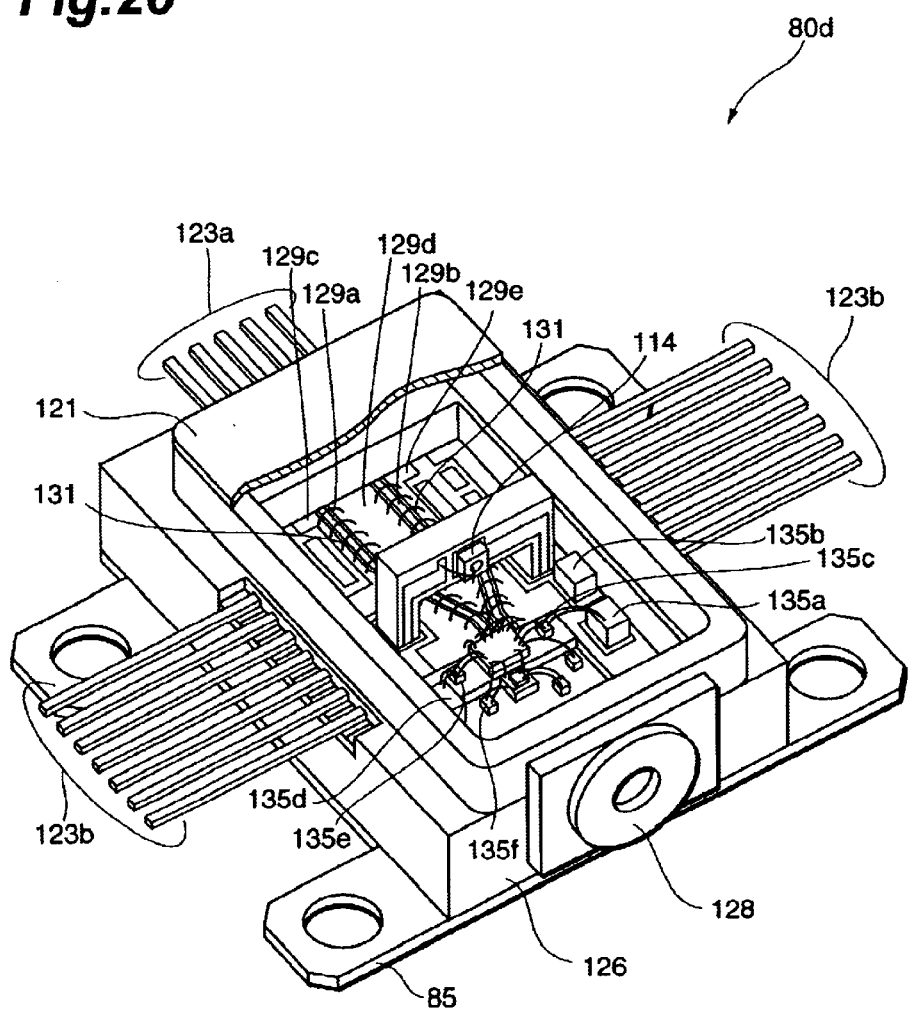
FIG. 20 shows the optical module of this embodiment.

FIG. 19 shows the constituent parts of the optical module of yet another embodiment and FIG. 20 shows the optical module of this embodiment.

Referring now to FIGS. 19 and 20, the optical module 80d comprises a housing 81, the semiconductor light emitting device 84, the lens 90, the mounting member 94, the electronic component 98, the driver element 100, and the light receiving element 114. According to the optical module 80d, the lens 90 comprises an installation face 90a used for mounting the lens 90 on the first mounting face 86, and it is therefore possible to mount the lens 90 on the first mounting face 86 and to position the lens 90 on the first mounting face 86. The semiconductor light emitting device 84 is mounted on the second mounting face 88, and hence heat dissipation is favorable. The first and second mounting faces 86 and 88 are constituted from material exhibiting a thermal conductivity equal to or more than the first thermal conductivity, and it is therefore possible to implement the positioning of the lens directing light from the semiconductor light emitting device toward the optical window and to implement favorable heat dissipation for the semiconductor light emitting device.

The structure of the housing will now be described with reference to FIGS. 19 and 20. The housing 81 comprises a base 85, a first side wall member 125, a second side wall member 127, and a lid 121. The first side wall member 125 and the second side wall member 127 are arranged on the base 85. This arrangement forms a cavity for housing optical components, such as the lens 90, and electronic components, such as the semiconductor light emitting device and the driver element. The lid 121 covers the second side wall member 127 to seal the cavity. The base 85 comprises an outer bottom face 85a, an inner bottom face 85b, and flanges 85c. The outer bottom face 85a is provided such that the optical module 80 is mounted on a substrate having a flat face. The inner bottom face 85b is provided such that the mounting member 94 and the first side wall member 125 can be mounted thereon. The flanges 85c extend from the base 85. In a preferred embodiment, the material of the base 85 is an electrically conductive material.

The first side wall member 125 has a structure like that of the first side wall member 116 and provides the housing 81 with side walls 125c, 125d, and 125e, for example. The first side wall member 125 comprises an opening 125m. The mounting member 94 is provided in the opening 125m of the first side wall member 125. The first side wall member 125 comprises a front end face 125s.

The second side wall member 127 is arranged on the base 85 and the first side wall member 125 so as to make contact on the side walls 125c, 125d, and 125e and the front end face 125s. After this arrangement, the optical window 92, which is provided in a front wall 127a of the second side wall member 127, is positioned with respect to the opening 125m of the first side wall member 125.

Similarly to the first side wall member 116, the first side wall member 125 comprises a plurality of insulation layers. In a preferred embodiment, the insulation layers are constituted from a ceramic material and it is thus possible to manufacture the first side wall member 125 using the method of forming a ceramic circuit substrate. The first side wall member 125 comprises a plurality of electrically conductive patterns, similarly to the first side wall member 116. The electrically conductive layers are provided between ones of the insulation layers. The first side wall member 125 comprises wiring pads provided on the wiring face 125b, similarly to the first side wall member 116. The first side wall member 125 includes vias to connect the wiring pads and the electrically conductive patterns with each other, similarly to the first side wall member 116. In the first side wall member 125, the following components are electrically connected via the electrically conductive patterns, the vias, and the wiring pads: the electronic components 135a to 135f and light receiving element 114 which are mounted on the wiring face 125b; the semiconductor light emitting device 84 and driver element 100; and the lead terminals 123a and 123b. The wiring face 125b comprises a pair of wiring patterns 129a and 129b for transmitting signals for driving the semiconductor light emitting device 84. Electrically conductive patterns 129c, 129d and 129e to which ground potential is applied are provided in regions neighboring the both sides of the wiring patterns 129a and 129b. The optical module 80d comprises a plurality of bonding wires 131 that pass over the wiring patterns 129a and 129b and connect between ground potential lines 129c, 129d and 129e. According to the experiments by the inventors, the bonding wires 131 are preferable in order to stabilize the potential of the electrically conductive patterns neighboring each of the wiring patterns 129a and 129b. As described hereinabove, the first side wall member 125 comprises multiple insulation layers and electrically conductive patterns provided between these insulation layers, so that it is possible to implement transmission lines (micro-strip lines, strip lines, for example) serving to transmit high frequency electrical signals that realize transmission speeds of 10 Gbit per second (Gbps) or more. Consequently, this housing 82 is preferable in order to implement a small optical module for processing high frequency signals.

As described hereinabove, the optical modules in the embodiments can realize structures permitting the miniaturization of the height of the optical module by mounting, on a mounting member, a lens comprising an installation face and a semiconductor light emitting device optically coupled to this lens. Further, the semiconductor light emitting device and the driver element of the electronic components in the light generating module generate a large amount of heat and are mounted on a mounting member exhibiting superior heat dissipation to decrease the temperature of the semicondutor light emitting device and the driver element. Moreover, a housing structure and a connecting structure can be integrally formed: the housing structure is provided for arranging electronic components other than the semiconductor light emitting device and the driver element; and the connecting structure is provided to connect the electronic components to one another. Consequently, there is no need to separately prepare a circuit substrate.

Have illustrated and described the principles of the present invention by way of preferred embodiments, it is apparent to a person skilled in the art that the present invention can be modified in arrangements and details without departing from such principles. For example, the semiconductor light emitting device includes one of a semiconductor laser element, an EA modulator, and a semiconductor optical integrated element including a semiconductor laser and an EA modulator. Further, the side wall members are used to provide the side walls of the housing but are also able to provide the outer surface of the housing in addition thereto. The details of the structure of the side wall members can be changed as required. Therefore, we claim all rights to changes and modifications from the scope of the spirits of the claims.

What is claimed is:

1. A light generating module, comprising:
a housing having a base and an optical window, said base being made from material exhibiting a first thermal conductivity, and said base extending along a predetermined plane, said housing further including a side wall member provided on the base, the side wall member including a plurality of insulation layers and a plurality of electrically conductive layers, said insulation layers and said electrically conductive layers being provided on said base, said electrically conductive layers being provided between said insulation layers;
a semiconductor light emitting device provided in said housing, said semiconductor light emitting device being electrically connected to said electrically conductive layers;
a first mounting face made from material exhibiting a thermal conductivity equal to or more than said first thermal conductivity;
a lens, having an installation face, for directing light from said semiconductor light emitting device toward said optical window, said installation face of said lens being mounted on said first mounting face, said lens being provided in said housing; and
a second mounting face for mounting said semiconductor light emitting device, said second mounting face being made from material exhibiting a thermal conductivity equal to or more than said first thermal conductivity.

2. The light generating module according to claim 1,
wherein said material of said first mounting face is different from said material of the base;
wherein said thermal conductivity of said material constituting said first mounting face exceeds said first thermal conductivity;
wherein said material constituting said second mounting face is different from said material of said base; and
wherein said thermal conductivity of said material constituting said second mounting face exceeds said first thermal conductivity.

3. The light generating module according to claim 1, further comprising:
an optical fiber for receiving light from said semiconductor light emitting device via said optical window,
wherein a distance between a position of said lens and a position of said semiconductor light emitting device is greater than a distance between a position of said semiconductor light emitting device and a position in which said lens can collimate light from said semiconductor light emitting device; and wherein the number of lenses provided between said optical fiber and said semiconductor light emitting device is one.

4. The light generating module according to claim 1, further comprising:

a mounting member providing said first mounting face and said second mounting face, wherein said optical window, said lens, and said semiconductor light emitting device are arranged sequentially in a direction of a predetermined axis;

wherein said side wall member comprises first to third side walls, said first and second side walls extending in a direction of said predetermined axis, and said third side wall extending in a direction intersecting said predetermined axis, each of said first to third side walls comprises a wiring insulating face, said wiring insulating face extending along a plane intersecting an axis orthogonal to said predetermined plane, and said wiring insulating face being provided within said side walls;

wherein said side wall member comprises wiring patterns provided on said wiring insulating face;

wherein said wiring insulating face mounts electronic components electrically connected to said wiring patterns; and wherein said mounting member is provided between said first side wall and said second side wall.

5. The light generating module according to claim 1, wherein said housing further comprises a metal side wall member provided on said side wall member and base and a metal lid provided on said metal side wall member.

6. The light generating module according to claim 5, wherein said optical window is hermetically sealed.

7. The light generating module according to claim 1, further comprising:

an optical fiber for receiving light from said semiconductor light emitting device via said optical window, wherein said optical fiber is held by a holding member positioned on said side wall member.

8. The light generating module according to claim 4, further comprising:

a monitoring light receiving element provided on said wiring insulating face of said side wall member, said monitoring light receiving element being optically coupled to said semiconductor light emitting device.

9. The light generating module according to claim 1, further comprising a mounting member having said first mounting face and said second mounting face, wherein said mounting member is provided on said base.

10. The light generating module according to claim 9, further comprising:

a driver element electrically connected to the semiconductor light emitting device, said driver element being mounted on said mounting member.

11. The light generating module according to claim 10, wherein said mounting member comprises a first face, a second face, and a step, said step being provided between said first face and said second face;

wherein said semiconductor light emitting device is mounted on said first face;

wherein said driver element is mounted on said second face; and wherein a distance between said base and said first face of said mounting member is shorter than a distance between said base and said second face of said mounting member.

12. The light generating module according to claim 10, wherein a distance between said base and said first mounting face of said mounting member is shorter than a distance between said base and said wiring insulating face of said side wall member;

wherein said mounting member comprises a first face, a second face, and a step, said step being provided between said first face and said second face;

wherein said lens is mounted on said first face;

wherein said driver element is mounted on said second face; and wherein a distance between said base and said first face of said mounting member is shorter than a distance between said base and said second face of said mounting member.

13. The light generating module according to claim 1, wherein said lens is an aspherical lens.

14. The light generating module according to claim 1, wherein said lens comprises an opposed face, wherein said installation face extends along a plane intersecting an axis intersecting said first mounting face; and wherein said opposed face extends along another plane intersecting an axis intersecting said first mounting face.

15. The light generating module as claimed in claim 1, further comprising:

an adhesive member, including a UV curing agent, securing said installation face and said first mounting face to each other.

16. The light generating module according to claim 1, wherein said optical window comprises a light entry face extending along another plane intersecting said predetermined plane at a predetermined angle;

wherein said predetermined angle is greater than zero degrees and less than 90 degrees; and wherein said light entry face is inclined toward said base.

17. The light generating module according to claim 1, wherein material of said insulation layers of said side wall member contains alumina.

18. The light generating module according to claim 4, wherein material of said base contains Kovar; and wherein material of said mounting member contains copper tungsten.

19. The light generating module according to claim 4, wherein material of said base contains Kovar; and wherein material of said mounting member contains aluminum nitride.

* * * * *